(12) United States Patent
Numata et al.

(10) Patent No.: US 8,253,247 B2
(45) Date of Patent: Aug. 28, 2012

(54) SEMICONDUCTOR DEVICE AND METHOD FOR MANUFACTURING THE SAME

(75) Inventors: Noriko Numata, Tokyo (JP); Hiroshi Sato, Tokyo (JP); Toru Ueguri, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 205 days.

(21) Appl. No.: 12/756,208

(22) Filed: Apr. 8, 2010

(65) Prior Publication Data

US 2010/0258945 A1 Oct. 14, 2010

(30) Foreign Application Priority Data

Apr. 10, 2009 (JP) .................................. 2009-096165

(51) Int. Cl.
*H01L 23/48* (2006.01)
*H01L 21/44* (2006.01)

(52) U.S. Cl. ........... 257/734; 257/E23.01; 257/E21.506; 438/597

(58) Field of Classification Search .................. 257/734, 257/780, 781, 782, 783, 784, 785, 786, E23.001, 257/E23.01, E23.011–E23.019, E21.001, 257/E21.002, E21.04, E21.499, E21.506; 438/106, 118, 119, 120, 121, 122, 123, 124, 438/125, 126, 127, 584, 597, 613, 614, 615, 438/616, 617

See application file for complete search history.

(56) References Cited

U.S. PATENT DOCUMENTS

| 2006/0118932 A1* | 6/2006 | Nanba et al. .................. 257/678 |
| 2007/0141755 A1 | 6/2007 | Luechinger |
| 2009/0297786 A1 | 12/2009 | Delsman et al. |

FOREIGN PATENT DOCUMENTS

| JP | 2004-336043 A | 11/2004 |
| JP | 2006-135270 A | 5/2006 |
| JP | 2006-165518 A | 6/2006 |
| JP | 2006-196629 A | 7/2006 |
| JP | 2008-529303 T | 7/2008 |

* cited by examiner

*Primary Examiner* — Ha Tran T Nguyen
*Assistant Examiner* — Kevin Quinto
(74) *Attorney, Agent, or Firm* — Miles & Stockbridge P.C.

(57) ABSTRACT

In a method for manufacturing a semiconductor device involving the step of bonding a metallic ribbon to a pad of a semiconductor chip, breakage of the metallic ribbon is to be prevented while ensuring the bonding strength even when the metallic ribbon becomes thin with reduction in size of the semiconductor chip. In bonding an Al ribbon to a pad of a semiconductor chip by bringing a pressure bonding surface of a wedge tool into pressure contact with the Al ribbon while applying ultrasonic vibration to the ribbon positioned over the pad, recesses 10a are formed beforehand at both end portions respectively of the wedge tool lest both end portions in the width direction of the Al ribbon bonded to the pad should contact the pressure bonding surface of the wedge tool.

18 Claims, 31 Drawing Sheets

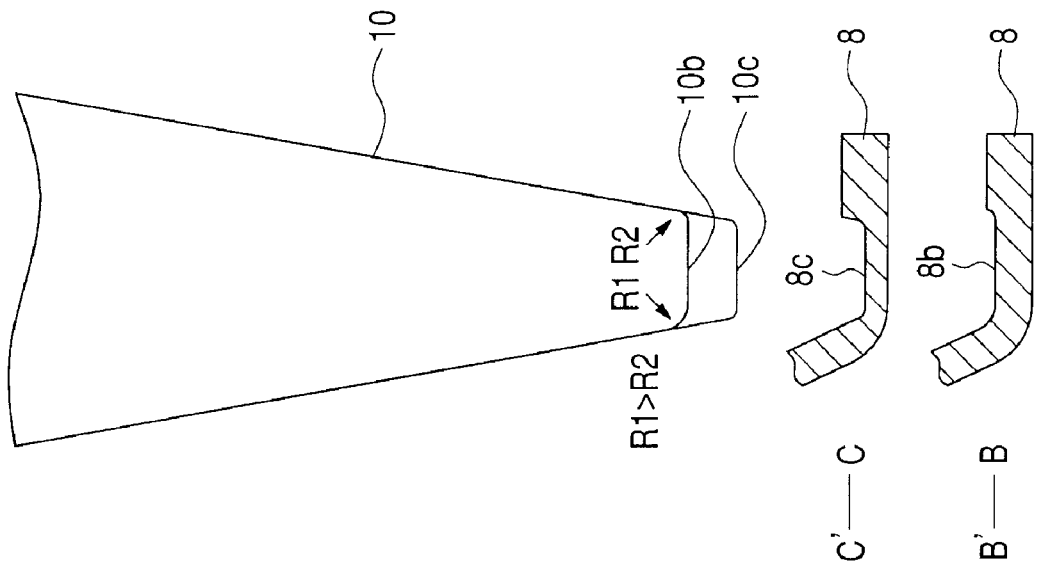
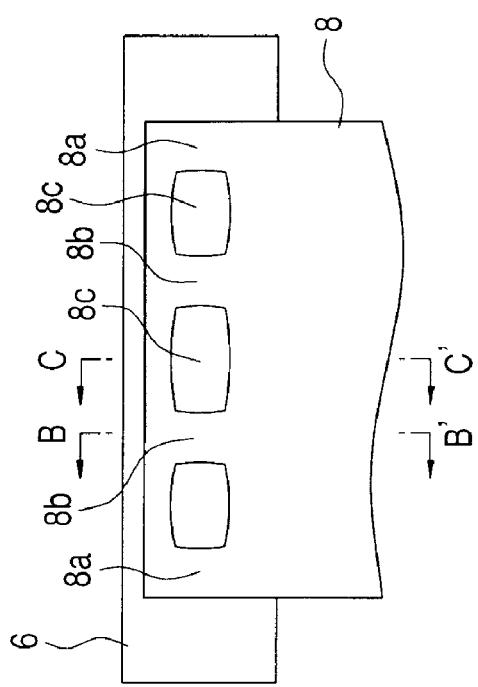

SEMICONDUCTOR DEVICE AND METHOD FOR MANUFACTURING THE SAME

CROSS-REFERENCE TO RELATED APPLICATIONS

The disclosure of Japanese Patent Application No. 2009-96165 filed on Apr. 10, 2009 including the specification, drawings and abstract is incorporated herein by reference in its entirety.

BACKGROUND OF THE INVENTION

The present invention relates to a semiconductor device and a manufacturing technique for the same. Particularly, the present invention is concerned with a semiconductor device wherein a bonding pad of a semiconductor chip and a lead frame are coupled together using a metallic ribbon, as well as a technique effectively applicable to the manufacture thereof.

A semiconductor chip having formed thereon power MOS-FETs (Metal Oxide Semiconductor Field Effect Transistors) each used for example as a power control switch or a charge/discharge protecting circuit switch in a portable information device, is sealed in a small-sized surface mount package such as a flat lead package or a SOP-8.

A back surface of the above semiconductor chip configures a drain of the power MOSFETs and is bonded onto a die pad portion of a lead frame through a conductive adhesive such as Ag paste. In a top layer of a main surface of the semiconductor chip there is formed a source pad coupled to sources of the power MOSFETs and a gate pad coupled to gate electrodes of the same transistor. The source pad is formed at a wider area than the gate pad in order to decrease ON resistance of the power MOSFETs.

Plural leads which configure external coupling terminals are exposed to the exterior of molding resin which seals the semiconductor chip. These leads comprise source, drain and gate leads. The drain leads are integral with the die pad portion and are electrically coupled to the back surface of the semiconductor chip (drain of the power MOSFETs) mounted on the die pad portion.

Recently, in the surface mount package of the above structure, the technique of coupling a source pad and source leads with use of a flexible metallic ribbon has been adopted practically in order to decrease ON resistance of the power MOS-FETs.

The metallic ribbon is formed for example by Al (aluminum) foil or Cu (copper) foil having a thickness of several hundred μm or so and the width thereof is generally 1 mm or so though it differs depending on the source pad width. For coupling the metallic ribbon to the source pad or source leads there is used a wedge bonding method which utilizes ultrasonic vibration.

The metallic ribbon is advantageous in that the ribbon width is much larger than the diameter of Au (gold) wire and that therefore even with a single metallic ribbon it is possible to ensure a sufficient coupling area for the source pad and ON resistance of the power MOSFETs can be greatly reduced as compared with the case where both source pad and source leads are coupled together using plural Au wires. Besides, there also is an effect that the cost of the package material can be reduced because the ribbon is formed by Al which is cheaper than Au.

Patent Document 1 discloses an improved technique of a wedge tool used for coupling the above metallic ribbon. In a lower surface of the wedge tool described in Patent Document 1 there are formed plural grooves or notches in parallel with the extending direction of the metallic ribbon. Therefore, when the wedge tool is brought into pressure contact with the metallic ribbon disposed on a semiconductor chip, only a part of the tool lower surface comes into contact with the metallic ribbon. Consequently, the propagation of excessive ultrasonic vibration energy from the wedge tool to the surface of the semiconductor chip can be prevented and hence the occurrence of damage such as a crack or a fissure in the semiconductor chip is decreased.

In Patent Document 2 is disclosed a wedge tool for ribbon bonding wherein plural projections and plural grooves each formed between adjacent such projections are formed on a pressure bonding surface.

In Patent Document 3 is disclosed a wedge tool for ribbon bonding wherein plural projections are formed on a pressure bonding surface. In each of the plural projections, two side faces opposed to each other are inclined relative to the pressure bonding surface, while other two side faces adjacent to the two side faces are nearly perpendicular to the pressure bonding surface.

In Patent Document 4 is disclosed a technique wherein projections are formed by knurling on a pressure bonding surface of a wedge tool for ribbon bonding, then the projections are pushed onto a metallic ribbon in ultrasonic bonding to apply a pushing load and ultrasonic vibration to the metallic ribbon, thereby forming ultrasonically bonded portions corresponding to a required energizing capacity dispersedly in an overlapped surface area between a heat spreader and the metallic ribbon.

In Patent Document 5 is disclosed a technique wherein one or plural loops are formed in a metallic ribbon when bonding the ribbon to a pad.

PRIOR ART DOCUMENTS

Patent Document 1

Japanese Unexamined Patent Publication No. 2006-196629

Patent Document 2

Japanese Unexamined Patent Application Publication (Translation of PCT Application) No. 2008-529303

Patent Document 3

Japanese Unexamined Patent Publication No. 2006-165518

Patent Document 4

Japanese Unexamined Patent Publication No. 2006-135270

Patent Document 5

Japanese Unexamined Patent Publication No. 2004-336043

SUMMARY OF THE INVENTION

For bonding a metallic ribbon to a source pad on a semiconductor chip having powder MOSFETs formed thereon, first a front end portion of the metallic ribbon is positioned above the source pad on the semiconductor chip, the bottom (a pressure bonding surface) of a wedge tool is brought into pressure contact with the metallic ribbon and ultrasonic vibration is applied to the ribbon. As a result, the metallic ribbon is crushed at the region where it is in contact with the bottom of the wedge tool, and is bonded to the surface of the source pad.

However, if an attempt is made to increase the number of semiconductor devices obtained from a semiconductor wafer for the purpose of cost reduction, external dimensions of a semiconductor chip become smaller and so does the area of a source pad. To carry out bonding while forming a stable loop for the source pad thus reduced in area, it is necessary to reduce the thickness of the metallic ribbon.

However, if the thickness of the metallic ribbon is reduced, the metallic ribbon becomes easier to break when bonded to the source pad surface, because the thickness of its portion crushed by the wedge tool becomes extremely small.

For preventing such breaking of the metallic ribbon it is necessary to make some improvement for the wedge tool. However, in any of Patent Documents 1 to 5 there is found no description about a technique for bonding a metallic ribbon stably to such a fine pad.

It is an object of the present invention to provide a technique which, in the manufacture of a semiconductor device including the step of bonding a metallic ribbon to a pad on a semiconductor chip, can prevent breaking of the metallic ribbon while ensuring a required bonding strength even in the case where the metallic ribbon becomes thin as a result of reduction in size of the semiconductor chip.

The above and other objects and novel features of the present invention will become apparent from the following description and the accompanying drawings.

The following is a brief description of typical inventions out of the inventions disclosed in the present application.

In one aspect of the present invention there is provided a semiconductor device comprising a semiconductor chip, a first conductor disposed near the semiconductor chip, and a metallic ribbon for coupling a pad formed over a main surface of the semiconductor chip and the first conductor electrically with each other, wherein the metallic ribbon coupled to the pad of the semiconductor chip is thicker at its both end portions in its width direction than its portion located inside the both end portions.

In another aspect of the present invention there is provided a method for manufacturing a semiconductor device, comprising the step of bonding a metallic ribbon to a pad formed over a main surface of a semiconductor chip, wherein a wedge tool is used in the bonding step and it is formed with recesses at both end portions respectively of a pressure bonding surface thereof opposed to both end portions in the width direction of the metallic ribbon.

The following is a brief description of an effect obtained by the above typical inventions.

Even when the thickness of the metallic ribbon becomes smaller with reduction in size of the semiconductor chip, it is possible to prevent breaking of the metallic ribbon while ensuring a required bonding strength.

BRIEF DESCRIPTION OF THE DRAWINGS

FIG. 22(a) is a plan view of an Al ribbon bonded to a source pad and FIG. 22(b) comprises a side view showing the shape of a front end portion of the wedge tool and sectional views of the Al ribbon taken along lines B-B' and C-C' respectively in FIG. 22(a);

DETAILED DESCRIPTION OF THE PREFERRED EMBODIMENTS

Figure 1A:
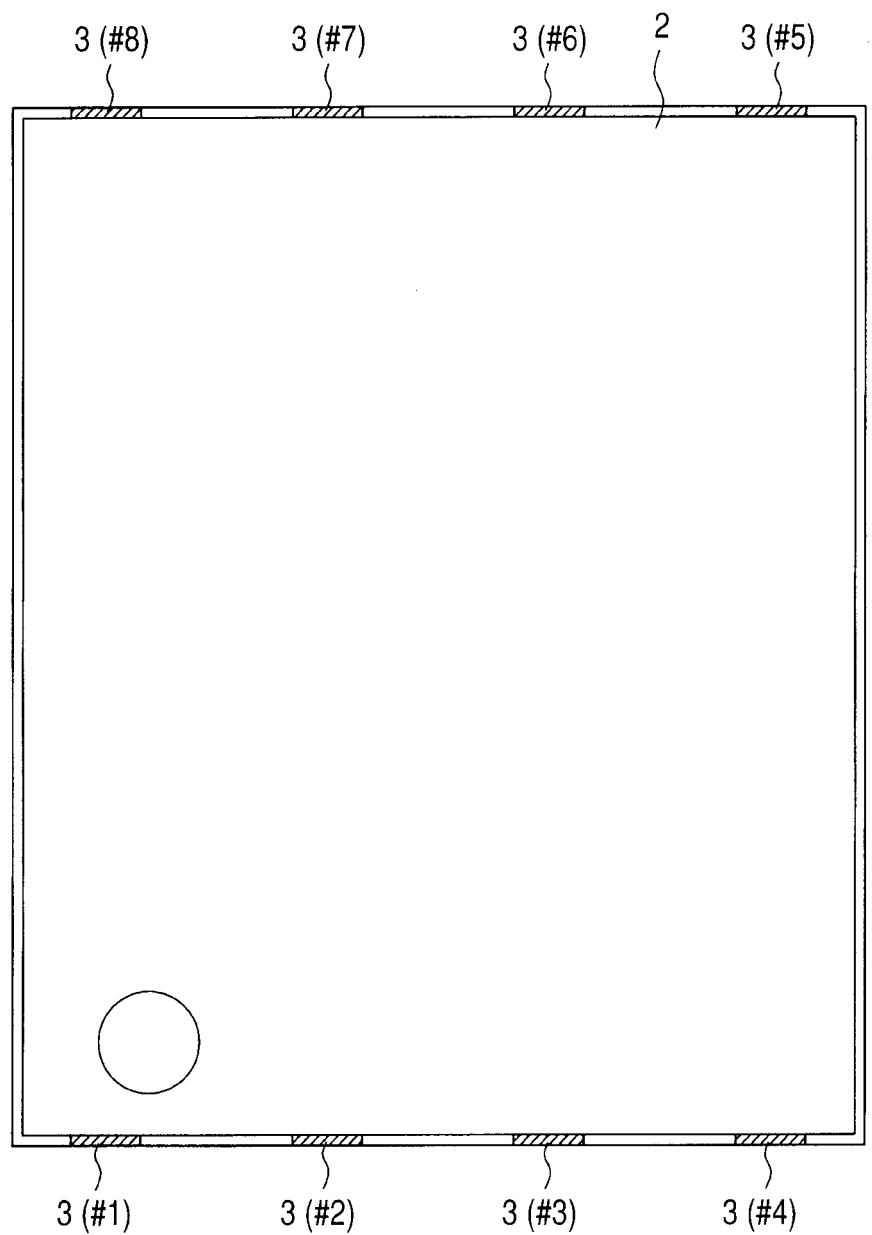
FIG. 1(a) is a plan view showing an upper surface of a semiconductor device according to a first embodiment of the present invention and FIG. 1(b) is aside view on a short side of the semiconductor device.

Embodiments of the present invention will be described below in detail with reference to the drawings. In all of the drawings for illustrating the embodiments, the same members are identified by the same reference numerals in principle and repeated explanations thereof will be omitted.

In the following embodiments, explanations of the same or similar portions will not be repeated in principle except when such explanations are specially needed. In the drawings for illustrating the following embodiments, even a plan view may be hatched to make the illustrated configuration easier to understand.

In the following embodiments, by the term "Al ribbon" is meant a band-like wiring material configured by a conductive material containing Al as a principal component. Usually, Al ribbon is installed in a spooled state onto a bonding device. Al ribbon is extremely thin, so is characteristic in that when coupling it to a lead frame or to a pad on a semiconductor chip, its length and loop shape can be set arbitrarily.

First Embodiment

Figure 1B:
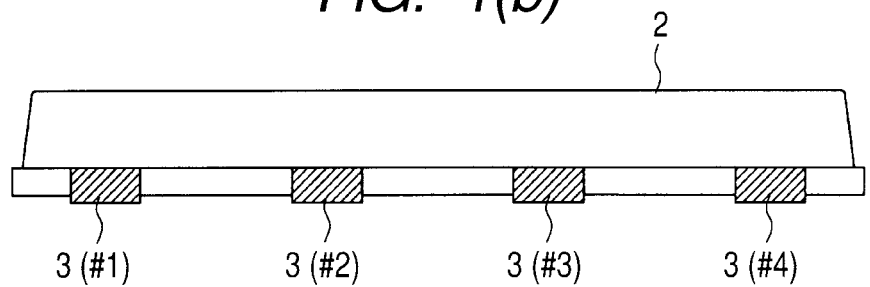
Figure 2:
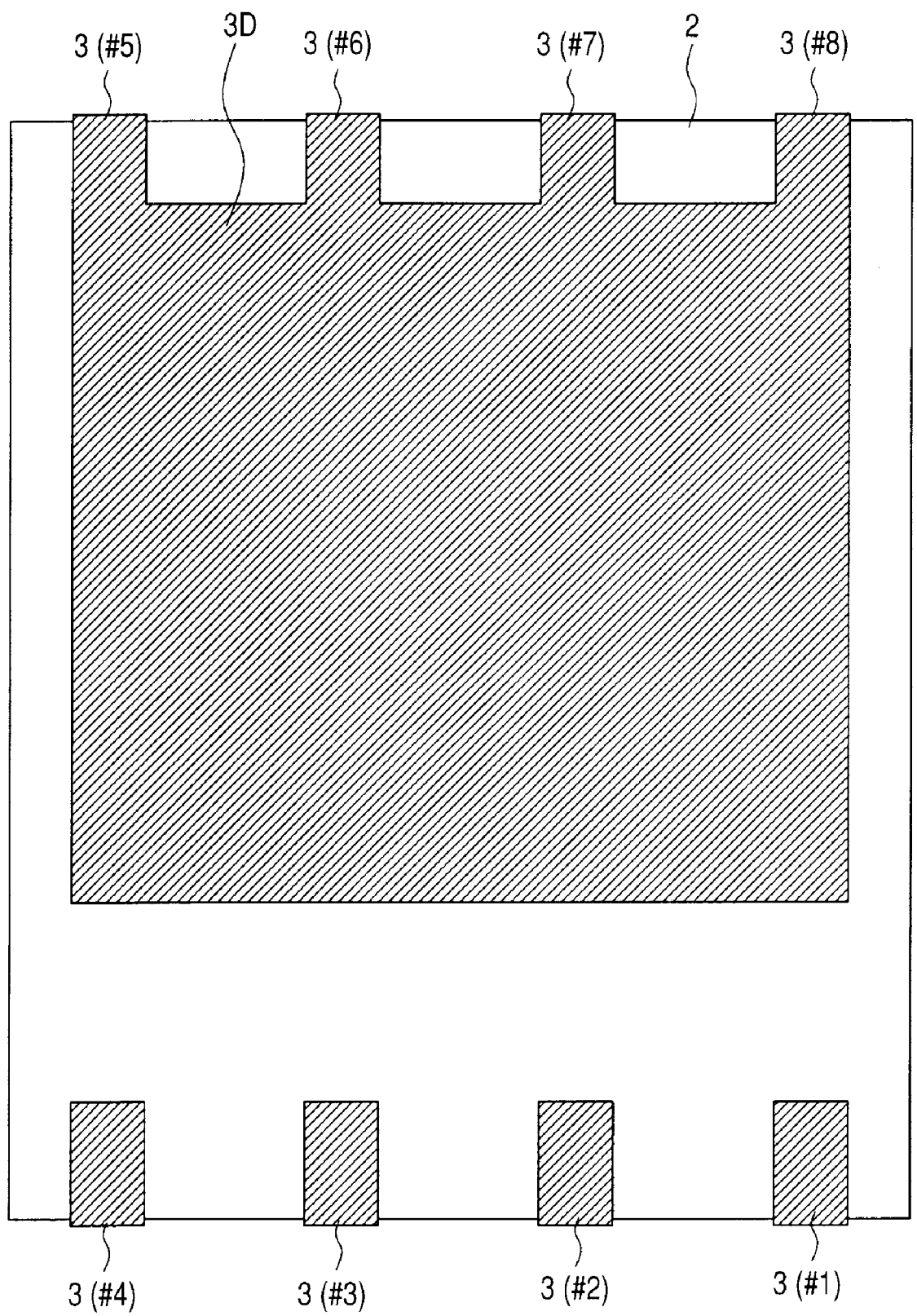
FIG. 2 is a plan view showing a back surface (component side) of the semiconductor device of the first embodiment.
Figure 3:
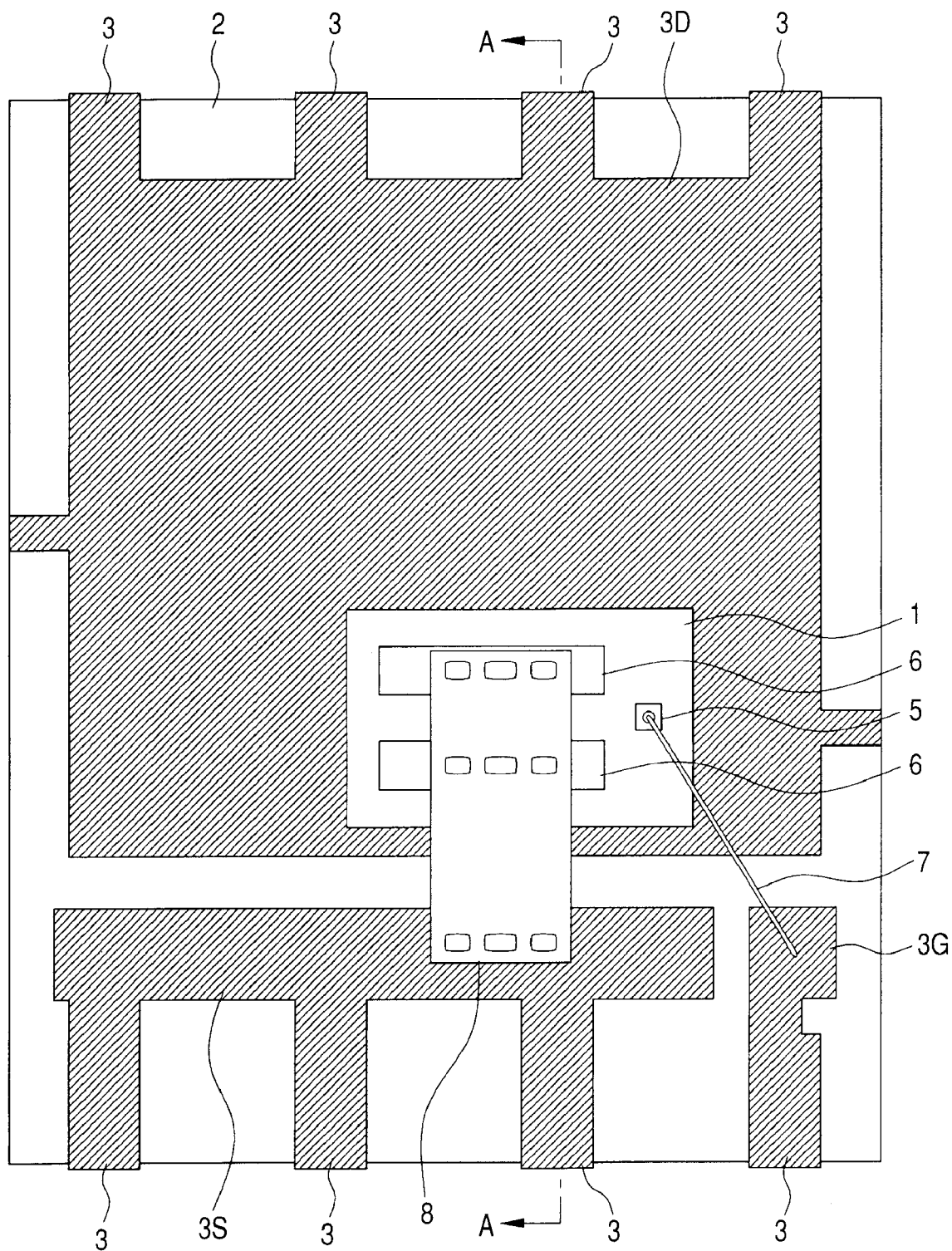
FIG. 3 is a plan view showing an internal structure of the semiconductor device of the first embodiment.
Figure 4:
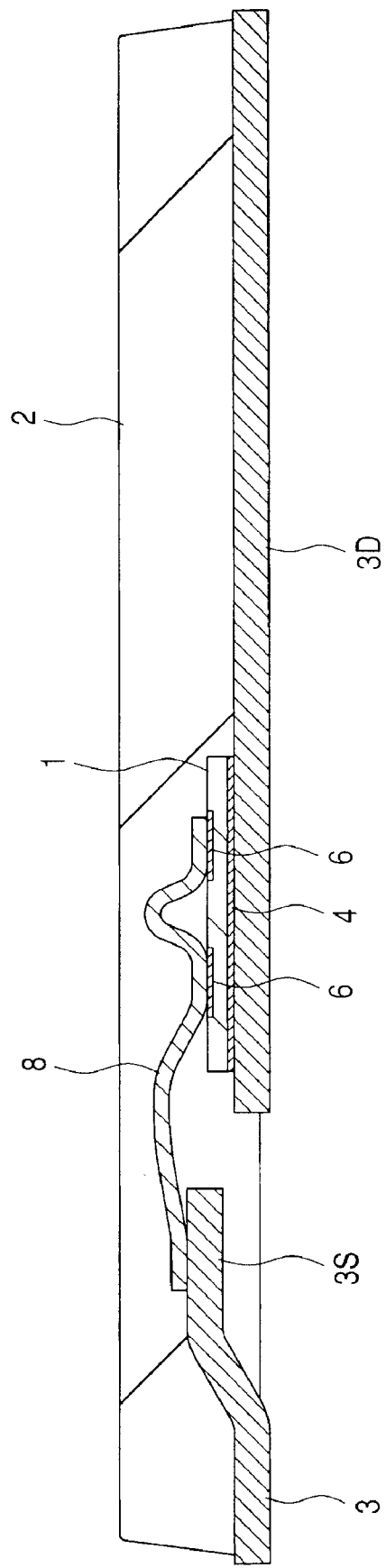
FIG. 4 is a sectional view taken along line A-A in FIG. 3.

The semiconductor device of this embodiment is applied to a flat lead package (hereinafter referred to as FLP) which is a kind of a surface mount package. FIG. 1(a) is a plan view showing an upper surface of the FLP, FIG. 1(b) is a side view on a short side, FIG. 2 is a plan view showing a back surface (component side), FIG. 3 is a plan view showing an internal structure, and FIG. 4 is a sectional view taken along line A-A in FIG. 3.

The FLP is a small-sized surface mount package wherein a semiconductor chip 1 mounted on a die pad portion 3D of a lead frame is sealed with molding resin 2. Its external dimensions are long side=6.1 mm, short side=5.3 mm, and thickness=0.8 mm.

Eight leads 3 (#1 to #8) which configure external coupling terminals of the FLP are exposed to short sides of the molding resin 2, the molding resin 2 being an epoxy resin impregnated with silicon filler. Of these leads, shown in FIGS. 1 and 2, No. 1 lead (#1) to No. 3 lead (#3) are source leads, No. 4 lead (#4) is a gate lead, and No. 5 lead (#5) to No. 8 lead (#8) are drain leads. Back surfaces of the eight leads 3 and a back surface of the die pad 3D are exposed to the exterior on a back surface of the molding resin 2 for the dissipation of heat generated in the semiconductor chip 1 and for the improvement of the package heat dissipating property. A three-layer plating as a laminate of Ni (nickel) film, Pd (palladium) film and Au (gold) film is applied surfaces of the die pad portion 3D and the eight leads 3.

Of the eight leads 3, the three source leads (#1 to #3) are coupled with one another in the interior of the molding resin 2. That is, the three source leads (#1 to #3) are coupled together electrically. The source leads positioned in the interior of the molding resin 2 will hereinafter be referred to as the source post 3S. Likewise, in the gate lead (#5), the portion positioned in the interior of the molding resin 2 will hereinafter be referred to as the gate post 3G. On the other hand, the four drain leads (#5 to #8) are formed integrally with the die pad portion 3D in the interior of the molding resin 2.

The semiconductor chip 1 is mounted on the die pad portion D through a conductive adhesive 4 such as, for example, Ag paste or solder. The semiconductor chip 1 is formed by a single crystal silicon and on a main surface thereof are formed plural power MOSFETs (power elements) each used for example as a power control switch or a charge/discharge protecting circuit switch in a portable information device. A back surface of the semiconductor chip 1 configures a drain common to those power MOSFETs and is coupled to the drain leads (#5 to #8) electrically through the die pad portion 3D.

On the main surface of the semiconductor chip 1 are formed one gate pad 5 coupled electrically to gate electrodes of the power MOSFETs and two source pads 6 coupled electrically to sources of the power MOSFETs. The gate pad 5 is coupled electrically to the gate post 3G through an Au wire 7. On the other hand, each of the two source pads 6 is formed at a wider area than the gate pad 5 to decrease ON resistance of the power MOSFETs and is coupled electrically to the source post 3S through an Al ribbon 8 which has a wider area than the Au wire 7.

Figure 5:
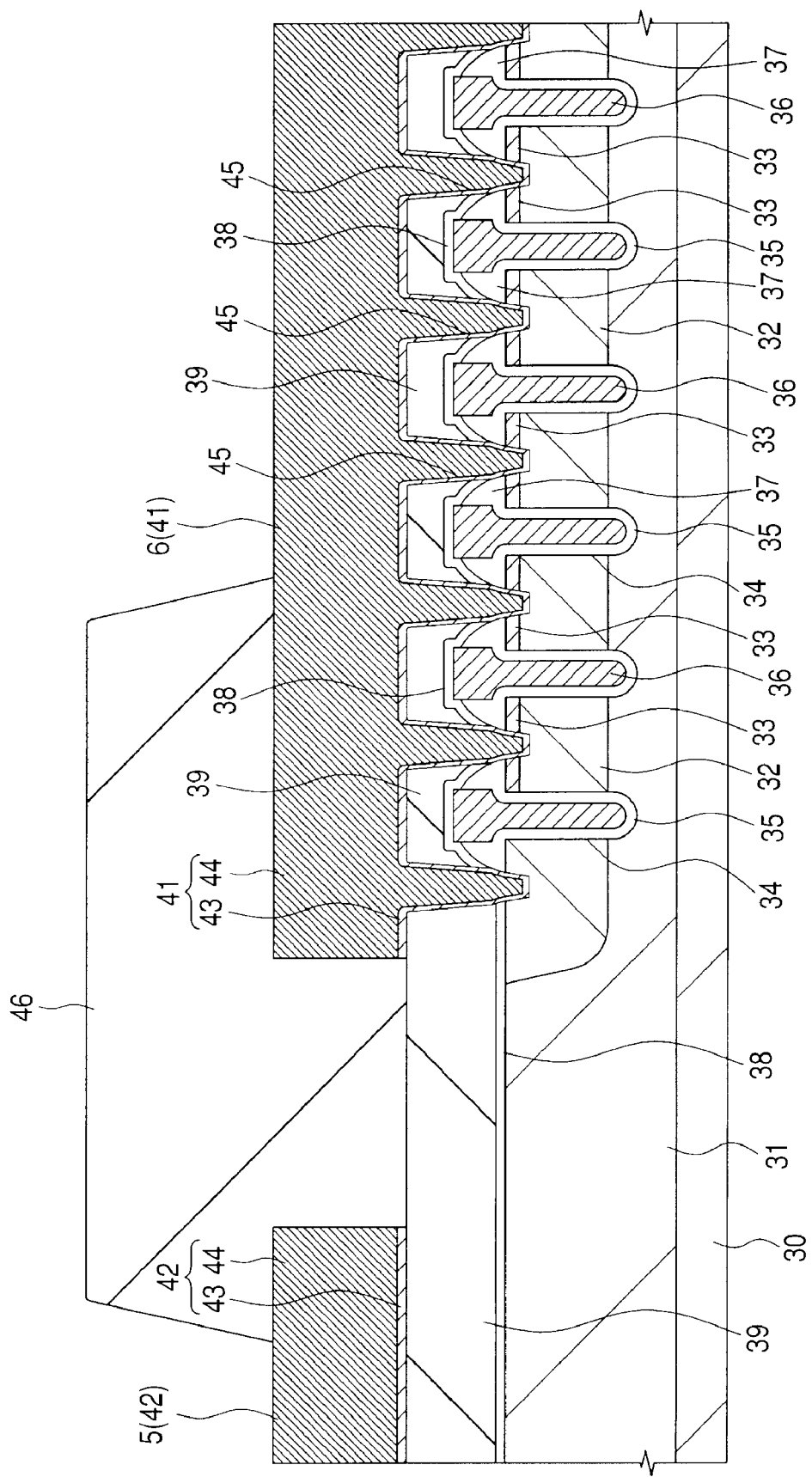
FIG. 5 is a sectional view of a principal portion, showing trench gate type n-channel power MOSFETs formed on a semiconductor chip.

FIG. 5 is a sectional view of a principal portion, showing trench gate type n-channel power MOSFETs.

An n$^-$ type single crystal silicon layer 31 is formed on a main surface of an n$^+$ type single crystal silicon substrate 30 and a p type semiconductor region 32 is formed in an upper portion of the n$^-$ type single crystal silicon layer 31, further, n$^+$ type semiconductor regions 33 are formed on a surface of the p type semiconductor region 32. The n$^+$ type single crystal silicon substrate 30 and the n$^-$ type single crystal silicon layer 31 are semiconductor regions which configure a drain of the power MOSFETs and the n$^+$ type semiconductor regions 33 are semiconductor regions which configure sources of the power MOSFETs. The p type semiconductor region 32 is a semiconductor region wherein channels of the power MOSFETs are formed.

In part of the p type semiconductor region 32 are formed trenches 34 whose bottoms reach the n$^-$ type single crystal silicon layer (drain) 31. In the interior of each trench 34 are formed a gate insulating film 35 and a gate electrode 36. The gate insulating film 35 is formed by a silicon oxide film, while the gate electrode 36 is formed by an n type polycrystalline silicon film. An upper end portion of each gate electrode 36 projects upwards above the trench 34 and side wall spacers 37 each formed by a silicon oxide film are formed on both sides of the upper end portion of the gate electrode. On top of the gate electrode 36 are formed a silicon nitride film 38 and a silicon oxide film 39.

A source electrode 41 and a gate lead electrode 42 are formed over the silicon oxide film 39. The source electrode 41 and the gate lead electrode 42 are each formed by a conductive film comprising a barrier metal film 43 and an Al alloy film 44 deposited thereon, the barrier metal film 43 being a laminated film of both Ti film and TiN film. The source electrode 41 is coupled electrically to the sources (n$^+$ type semiconductor regions 33) of the power MOSFETs through coupling holes 45 formed in the silicon nitride film 38 and the silicon oxide film 39. The gate lead electrode 42 is coupled electrically to the gate electrodes 36 of the power MOSFETs through coupling holes formed in the silicon nitride film 38 and the silicon oxide film 39 in a region (not shown).

A surface protecting film 46 formed by a laminated film of both silicon oxide film and silicon nitride film is formed over the source electrode 41 and the gate lead electrode 42. A part of the surface protecting film 46 which covers the top of the source electrode 41 is removed, allowing the source electrode 41 to be exposed to the surface of the semiconductor chip 1. Likewise, a part of the surface protecting film 46 which covers the top of the gate lead electrode 42 is removed, allowing the gate lead electrode 42 to be exposed to the surface of the semiconductor chip 1. The exposed region of the source electrode 41 exposed to the surface of the semiconductor chip 1 configures the source pad 6 and the exposed region of the gate lead electrode 42 exposed to the surface of the semiconductor chip 1 configures the gate pad 5. Though not shown in FIG. 5, the Al ribbon 8 is bonded to surfaces of the source pads 6 and the Au wire 7 is bonded to a surface of the gate pad 5.

Figure 6:
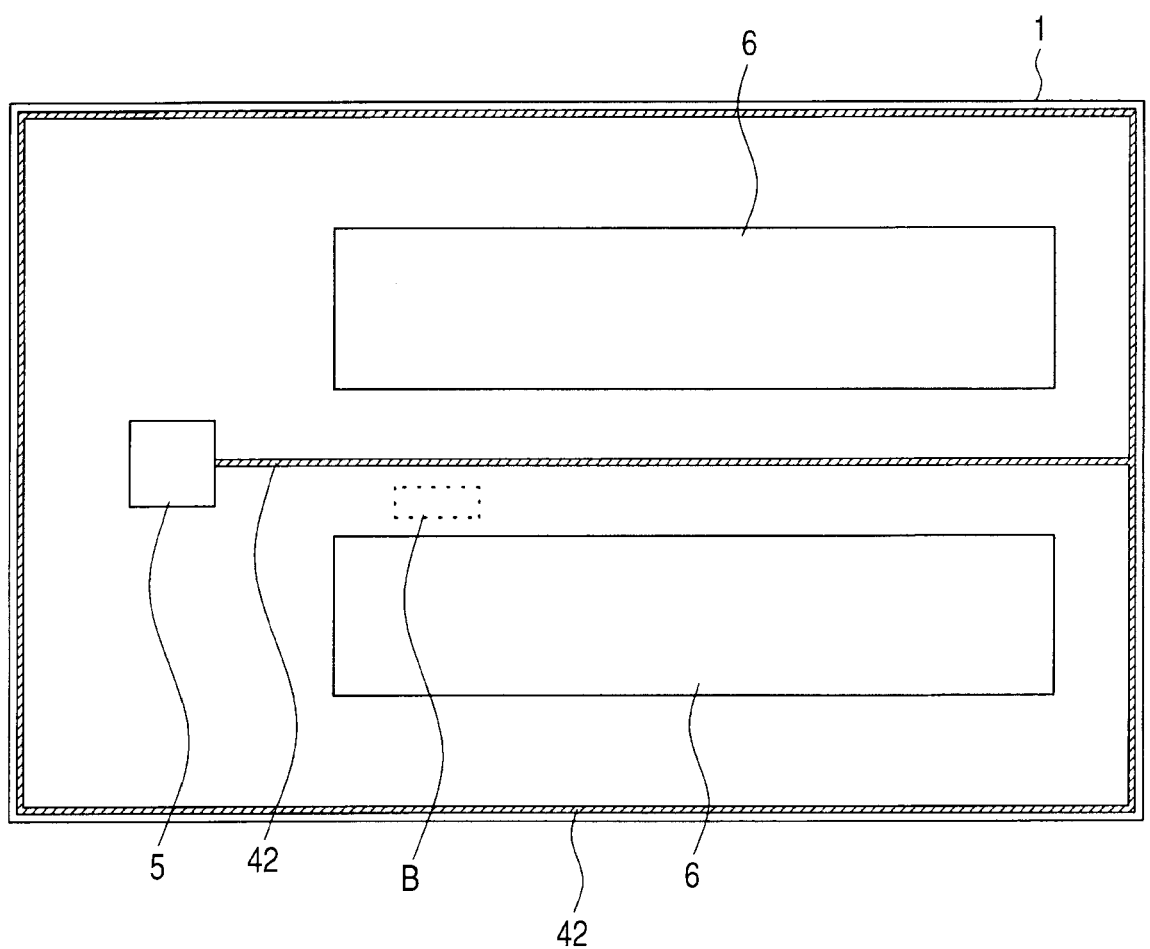
FIG. 6 is a plan view showing a layout of gate lead electrodes, a gate pad and source pads all formed on the semiconductor chip.

FIG. 6 is a plan view showing a layout of gate lead electrodes 42, gate pad 5 and source pads 6.

A planar shape of the semiconductor chip 1 is a rectangular shape having a long side length of 1.6 mm and a short side length of 1.0 mm. A planar shape of each of the two source pads 6 (6a, 6b) is a rectangular shape having a long side length of 1.02 mm and a short side length of 0.225 mm. Further, a planar shape of the gate pad 5 is a square shape with a one-side length of 0.12 mm.

Figure 7:
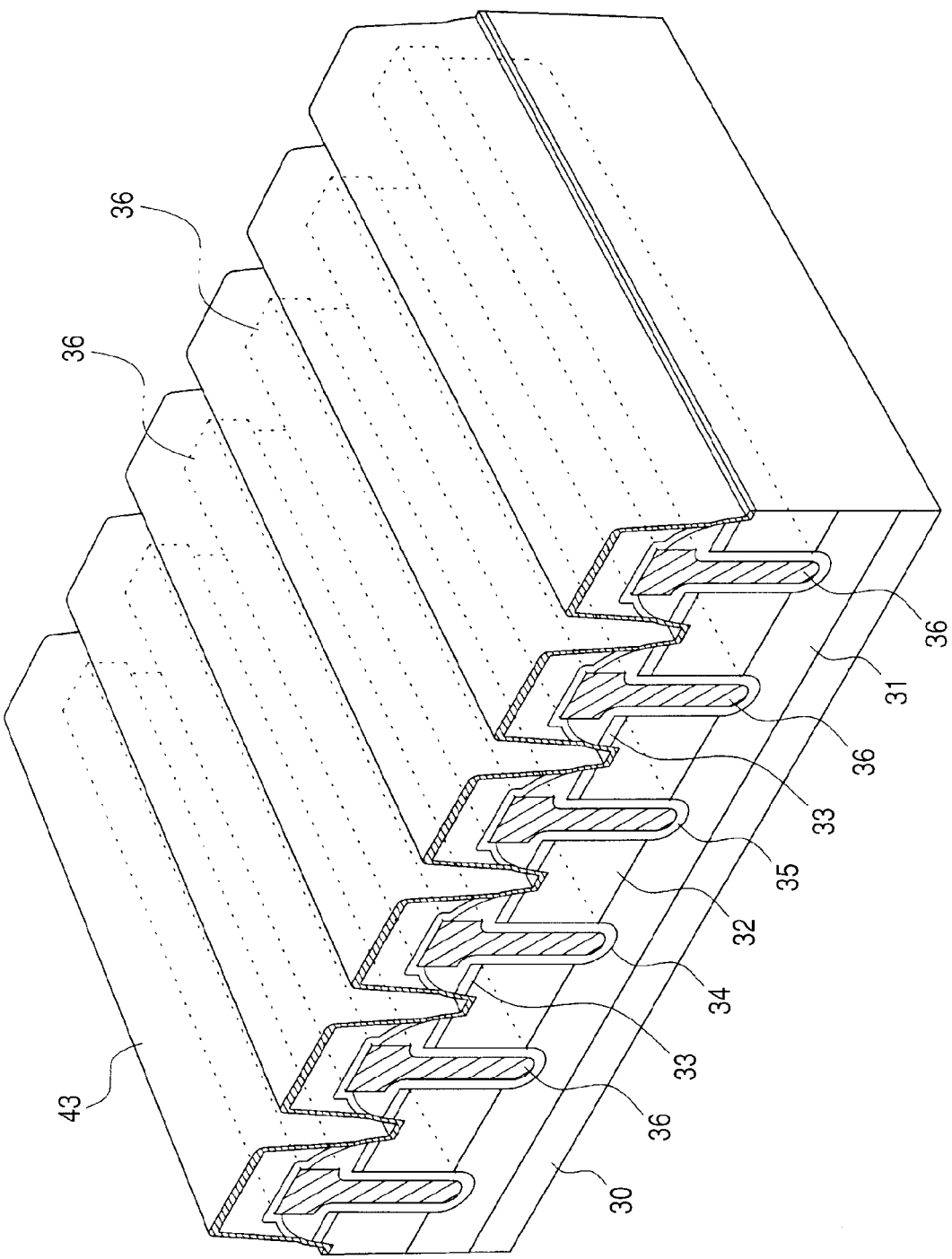
FIG. 7 is a perspective view showing a layout of gate electrodes in a region indicated at B in FIG. 6.

The gate lead electrodes 42 are disposed at both outer periphery portion and central portion respectively of the main surface of the semiconductor chip 1. The gate pad 5 is disposed at one end of the gate lead electrode 42 disposed centrally of the semiconductor chip 1. In the case where the gate lead electrodes 42 and the gate pad 5 are thus disposed on the main surface of the semiconductor chip 1, one end of the gate electrode 36 in each of the power MOSFETs extends rectilinearly toward the nearby gate lead electrode 42 and is coupled to the gate lead electrode 42 electrically, as shown in FIG. 7 (a perspective view showing a layout of gate electrodes 36 in the region indicated by the symbol B in FIG. 6). Thus, the gate electrodes 36 can be made shortest in length throughout the whole of the semiconductor chip 1. Consequently, gate resistance (Rg) is reduced to half or less and the switching characteristic of the power MOSFETs is improved, in comparison with for example a layout wherein one source pad 6 is disposed centrally of the semiconductor chip 1 and the gate pad 5 is disposed at the peripheral portion.

On the other hand, when a gate lead electrode 42 is disposed centrally of the semiconductor chip 1, source electrodes 41 each configured by a conductive film in the same layer as the gate lead electrode 42 are formed on both sides of the gate lead electrode 42. Therefore, source pads 6 are also disposed on both sides respectively of the gate lead electrodes 42.

Thus, in the FLP of this embodiment, in order to improve the switching characteristic of the power MOSFETs, a gate lead electrode 42 is disposed centrally of the semiconductor chip 1 to minimize the length of each gate electrode 36 coupled to the gate electrode 42, thereby decreasing the gate resistance (Rg). Consequently, two source pads 6 are disposed on both sides respectively of the gate lead electrode 42. Accordingly, one end of the Al ribbon 8 which couples the source post 3S and the semiconductor chip 1 electrically with each other is bonded to surfaces of the two source pads 6.

The following description is now provided about a problem encountered in case of bonding the Al ribbon 8 to the two source pads 6 on the semiconductor chip 1 with use of a wedge tool in a conventional ribbon bonding device.

Figure 8:
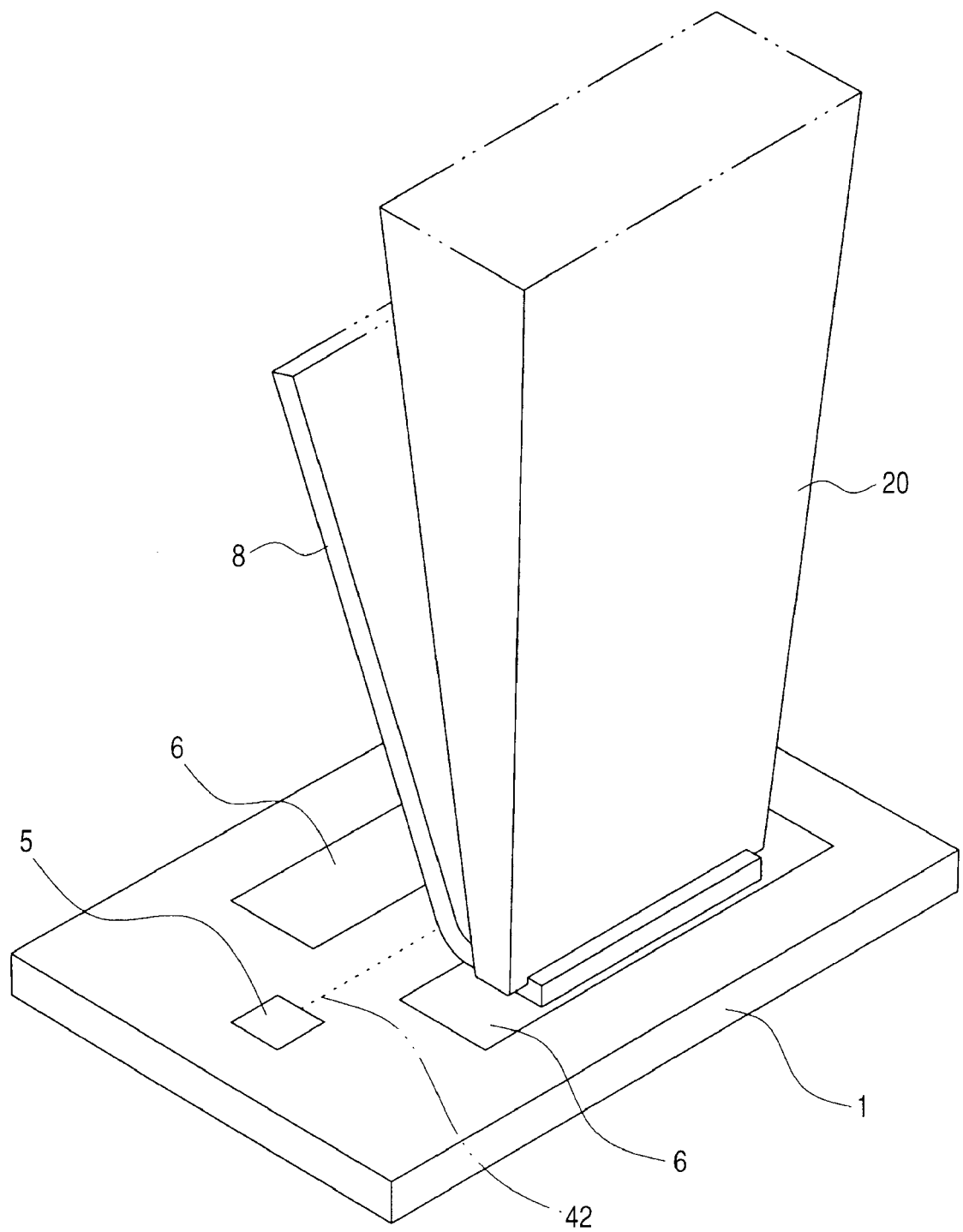
FIG. 8 is a perspective view illustrating a ribbon bonding method using a wedge tool in a conventional ribbon bonding device.
Figure 9:
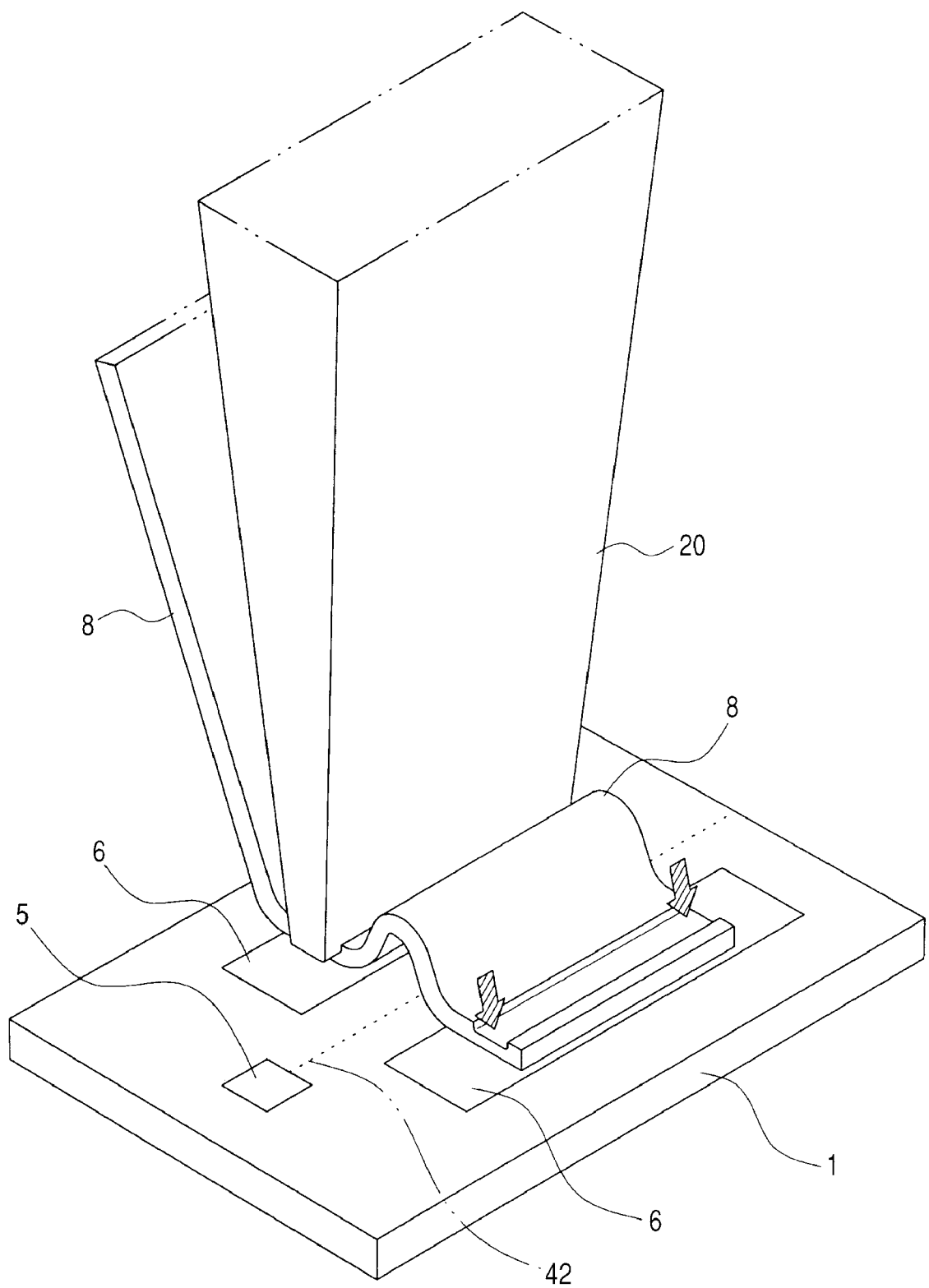
FIG. 9 is a perspective view illustrating the ribbon bonding method using the wedge tool in the conventional ribbon bonding method.

For bonding the Al ribbon 8 to the two source pads 6, first, as shown in FIG. 8, a front end portion of the Al ribbon is positioned on a first source pad 6 on the semiconductor chip 1, then a pressure bonding surface of a wedge tool 20 is brought into pressure contact with the Al ribbon 8 and ultrasonic vibration with energy of several W or so is applied to the Al ribbon. As a result, the Al ribbon 8 is crushed in its area which is in contact with the pressure bonding surface of the wedge tool 20, and is bonded to a surface of the first source pad 6. Next, the wedge tool 20 is moved onto a second source pad 6, then, as shown in FIG. 9, the pressure bonding surface of the wedge tool 20 is brought into pressure contact with the Al ribbon 8 and ultrasonic vibration with energy of several W is applied to the ribbon. As a result, the Al ribbon is crushed in its area which is in contact with a bottom of the wedge tool 20, and is bonded to a surface of the second source pad 6.

As noted above, the gate lead electrode 42 coupled to the gate pad 5 is disposed between the two source pads 6. Therefore, when bonding the Al ribbon 8 to the two source pads 6 with use of the wedge tool 20, as shown in FIG. 9, the Al ribbon 8 between the two source pads 6 is looped to avoid bonding damage to the gate lead electrode 42. At this time, if the height of the loop is made low, then at the time of sealing the semiconductor chip 1 with molding resin 2, the molding resin 2 cannot get into the gap between the surface of the semiconductor chip 1 and the Al ribbon 8, with consequent fear of formation of a void. In many cases, water stays in such a void and undergoes volume expansion under solder reflow at the time of mounting the semiconductor device onto a wiring substrate, thus causing an inconvenience such as package cracking for example. To avoid the occurrence of such an inconvenience it is necessary to adjust the loop height so that the molding resin 2 can get into the gap between the semiconductor chip 1 and the Al ribbon 8.

However, in the FLP of this embodiment, the external dimensions of the semiconductor chip 1 are very small and hence the spacing between the two source pads 6 is very narrow. Therefore, for forming a loop in the Al ribbon which straddles the two source pads 6, it is necessary that the thickness of the Al ribbon be as small as 0.1 mm or less, preferably 0.05 mm or less.

However, if the Al ribbon 8 is made so thin, then when the Al ribbon 8 is bonded to the surface of a source pad 6, the thickness of the portion crushed by the wedge tool 20 becomes extremely small, with the result that cracks are developed at both axial ends (the portions indicated by arrows in FIG. 9) of the Al ribbon 8, which cracks may advance inwards from the both ends, leading to breakage of the Al ribbon 8.

Moreover, if a loop is formed between the two source pads 6 which are spaced narrow from each other, the rise of the loop becomes very steep, so that a strong bending stress is imposed on the Al ribbon 8 at the loop rising area. Therefore, in case of bonding the extremely thin Al ribbon 8 to the two source pads 6 which are disposed in close proximity to each other, the Al ribbon is apt to break particularly on the first source pad 6.

In this embodiment, in view of the above-mentioned problem, bonding of the Al ribbon 8 is performed using the following wedge tool.

Figure 10A:
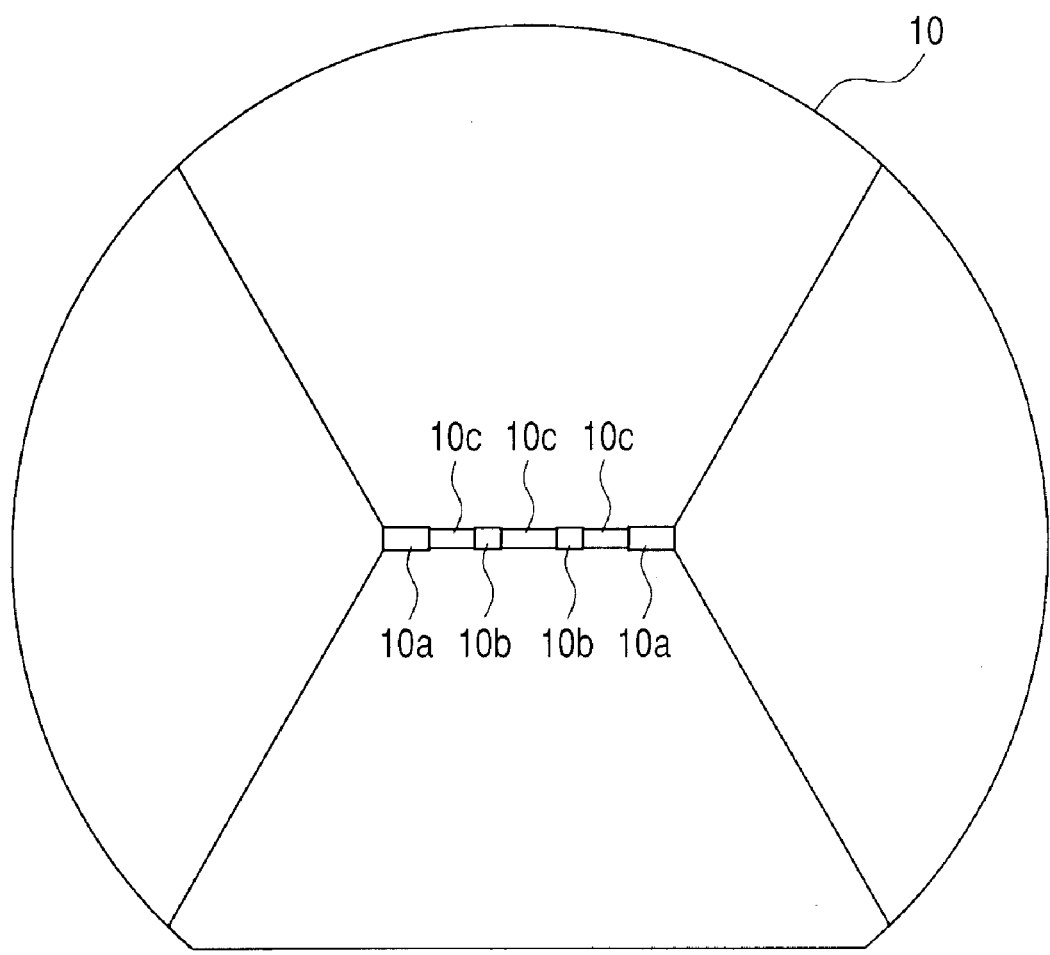
FIG. 10(a) is a plan view of a wedge tool as seen from below which wedge tool is used in a method for manufacturing the semiconductor device according to the first embodiment and FIG. 10(b) is a side view showing a pressure bonding surface of the wedge tool.
Figure 10B:
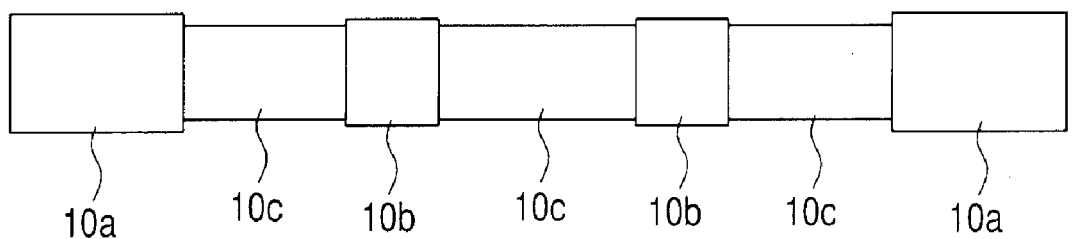
Figure 11A:
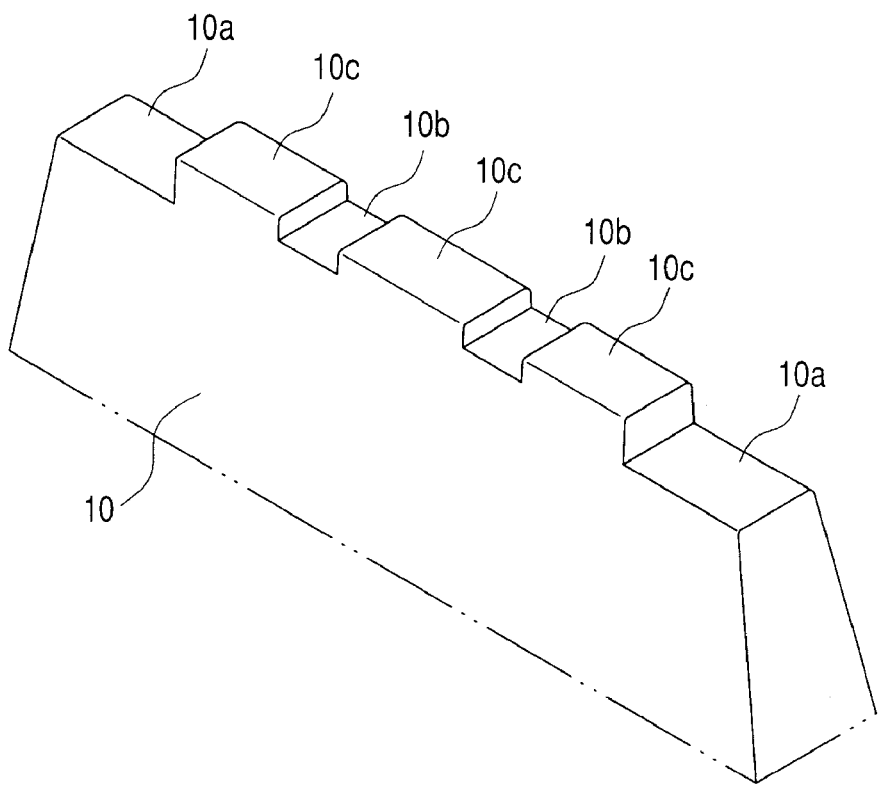
FIG. 11(a) is a perspective view showing a front end portion of the wedge tool used in the method for manufacturing the semiconductor device according to the first embodiment and FIG. 11(b) is a side view thereof.
Figure 11B:
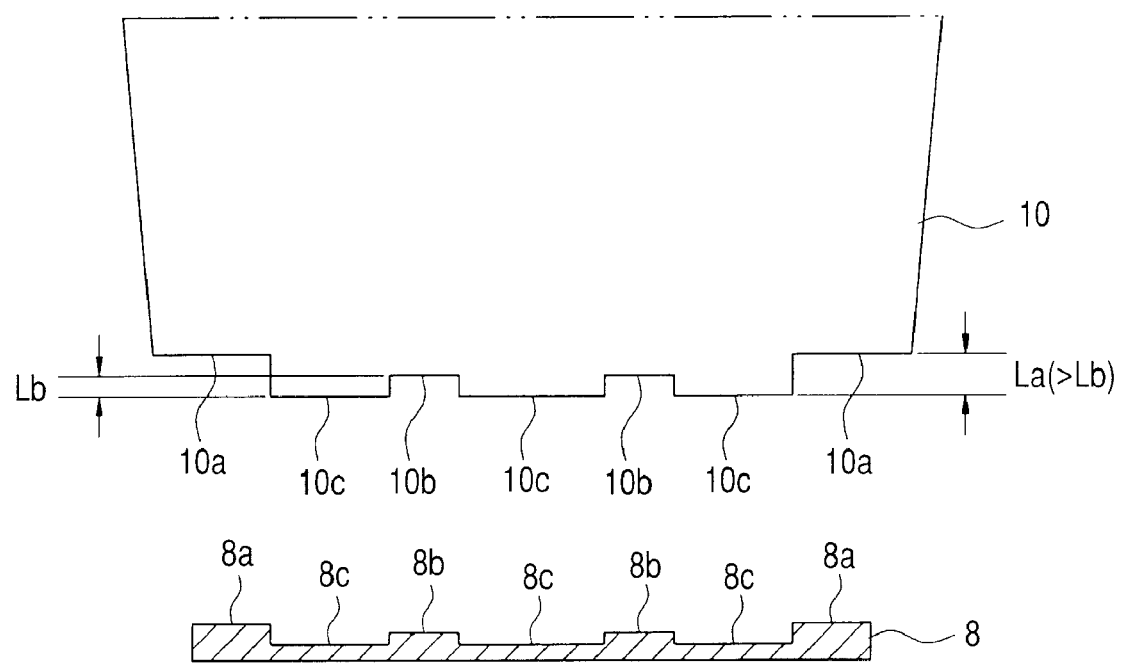

FIG. 10(a) is a plan view of the wedge tool used in this embodiment, as seen from below, FIG. 10(b) is a plan view showing a pressure bonding surface of the wedge tool, FIG. 11(a) is a perspective view showing a front end portion of the wedge tool, and FIG. 11(b) is a side view thereof. In FIG. 11(b) there also is shown a sectional structure of the Al ribbon with which the wedge tool is in pressure contact.

The wedge tool used in this embodiment is configured by metal such as stainless steel (SUS304) and its pressure bonding surface has a rectangular plane shape. The length of each long side of the pressure contact surface is larger than the width of the Al ribbon 8 and smaller (by say 0.89 mm to 0.9 mm or so) than each long side of each source pad 6. The length of each short side of the pressure contact surface is smaller (by say 0.09 mm or so) than each short side of each source pad 6.

The wedge tool 10 used in this embodiment has recesses 10a (first recesses) at both longitudinal ends of the pressure contact surface. On the other hand, three convex portions 10c are formed centrally of the pressure contact surface in a sandwiching relation to two shallow recesses 10b (second recesses). A difference in height, La, between each convex portion 10c and each recess 10a shown in FIG. 11(b) is set so as to be larger than the thickness of the Al ribbon 8. For example, if the thickness of the Al ribbon 8 is 0.05 mm, the difference in height between each convex portion 10c and each recess 10a is about 0.06 mm. Therefore, when the pressure bonding surface of the wedge tool 10 is brought into pressure contact with the Al ribbon 8, both end portions of the pressure contact surface do not come into contact with the Al ribbon 8.

That is, as shown in FIG. 11(b), the recesses 10a formed at both end portions of the pressure bonding surface of the wedge tool 10 are regions opposed to both end portions (thick film portions 8a) in the width direction of the Al ribbon 8. It follows that when the pressure bonding surface of the wedge tool 10 comes into pressure contact with the Al ribbon 8, both end portions (thick film portions 8a) in the width direction of the Al ribbon 8 do not contact the wedge tool 10.

The two shallow recesses 10b formed centrally of the pressure bonding surface of the wedge tool 10 are for relieving stress applied to the central part (thin film portions 8c) of the Al ribbon 8 to the environs (thick film portions 8a, 8b). The depth of each of the shallow grooves 10b, i.e., a difference in height, Lb, between each convex portion 10c and each recess 10b shown in FIG. 11(b), is smaller than the difference in height La between each convex portion 10c and each recess 10a, (La>Lb). That is, the thick film portions 8b and the thin film portions 8c of the Al ribbon correspond to the shallow recesses 10b and the convex portions 10c respectively of the wedge tool 10 and the thickness of the Al ribbon 8 is such that thick film portion 8a>thick film portion 8b>thin film portion 8c.

Figure 12A:
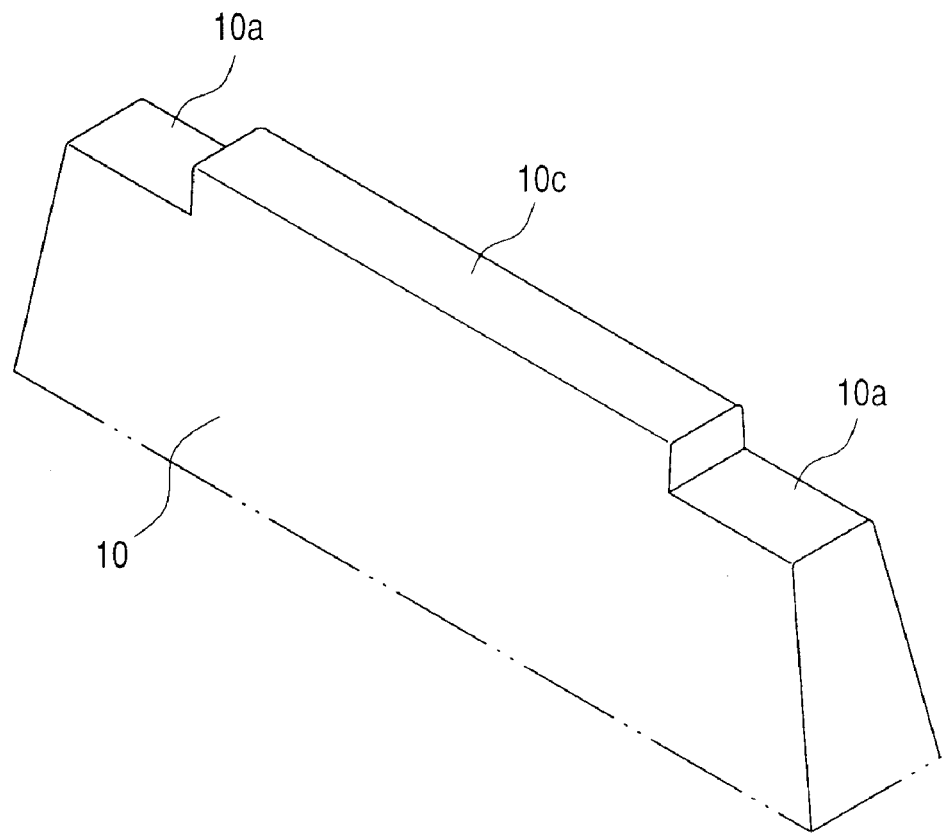
FIG. 12(a) is a perspective view showing another example of a front end portion of the wedge tool used in the method for manufacturing the semiconductor device according to the first embodiment and FIG. 12(b) is a side view thereof.
Figure 12B:
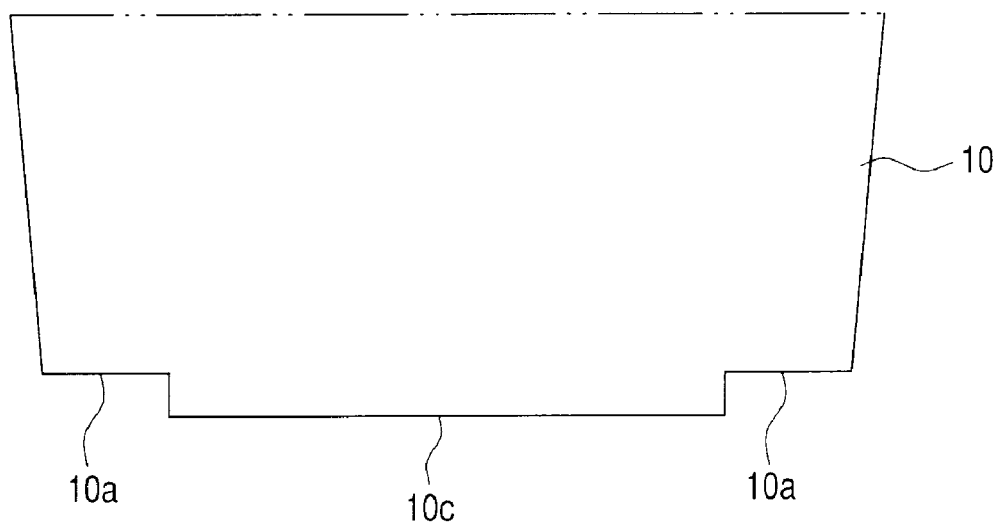
Figure 13A:
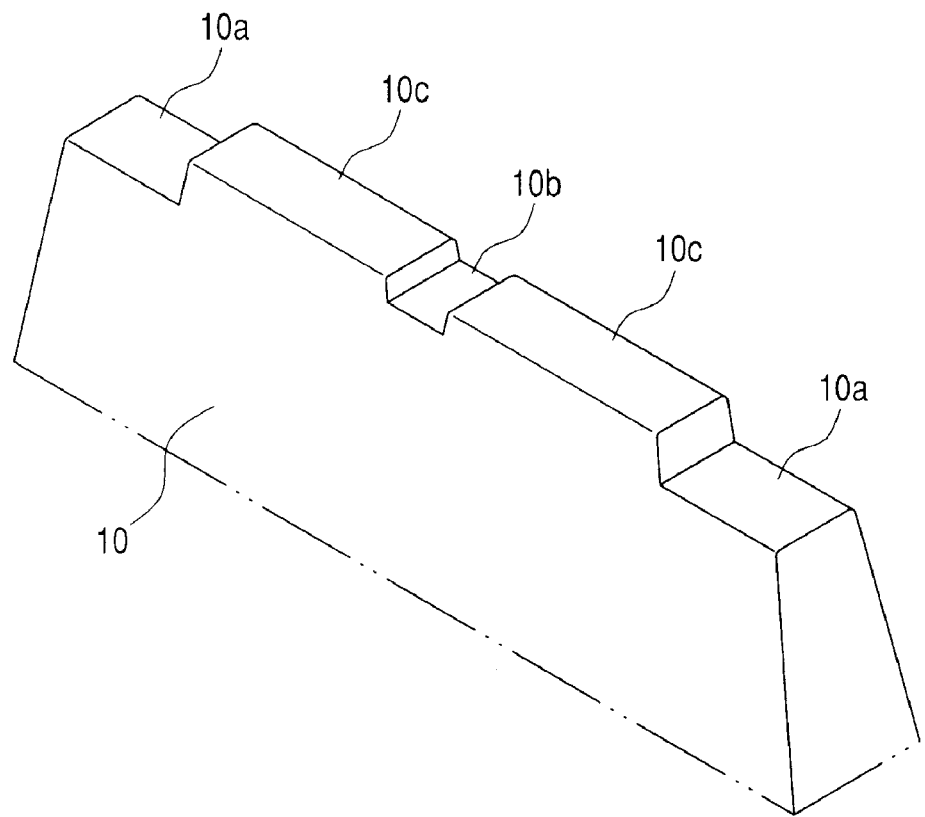
FIG. 13(a) is a perspective view showing a further example of a front end portion of the wedge tool used in the method for manufacturing the semiconductor device according to the first embodiment and FIG. 13(b) is a side view thereof.
Figure 13B:
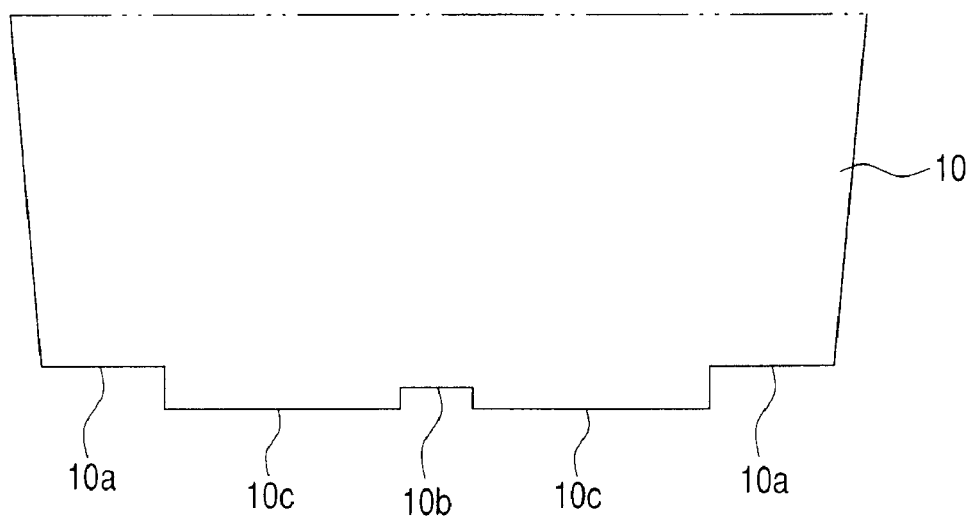

The shallow recesses 10b formed in the pressure bonding surface are not essential. For example, as shown in FIG. 12, a convex portion 10c may be formed throughout the whole of the central part. Alternatively, as shown in FIG. 13, a single shallow recess 10b may be formed at a central position. In both cases, by forming the recesses 10a at both end portions of the pressure bonding surface, there is no fear of cracks being developed in both end portions (thick film portions 8a) of the Al ribbon 8. Thus, it is possible to prevent a crack from advancing inwards of the Al ribbon 8 and causing breakage of the ribbon.

Figure 14:
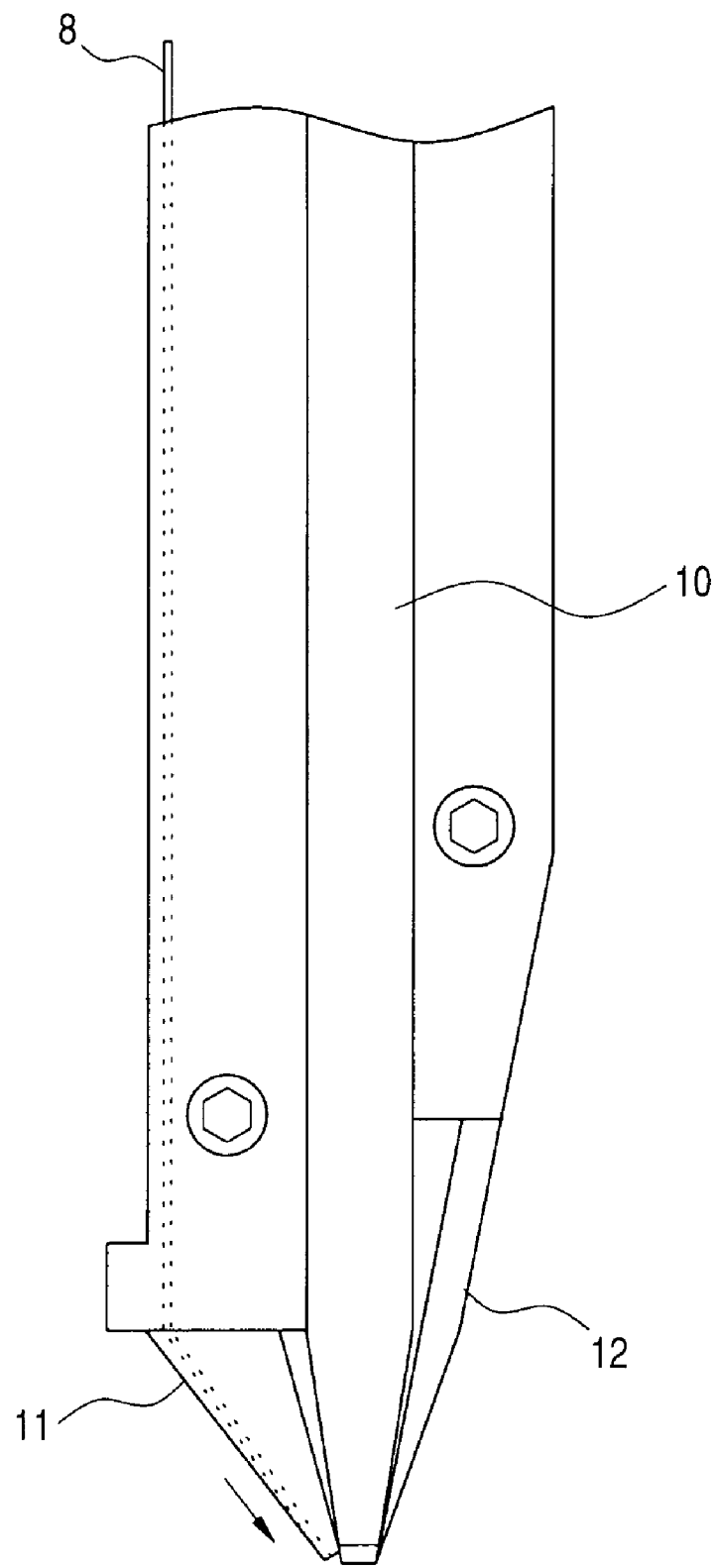
FIG. 14 is a side view showing a front end portion and the vicinity thereof of the wedge tool attached to a ribbon bonding device.

FIG. 14 is a side view showing a front end portion and the vicinity thereof of the wedge tool 10 as loaded to a ribbon bonding device. As shown in the same figure, a ribbon guide 11 for sending out the Al ribbon 8 to the pressure bonding surface of the wedge tool 10 is attached to one side face of the wedge tool 10. Likewise, a cutter 12 for cutting the Al ribbon 10 after completion of bonding is attached to the other side face of the wedge tool 10.

Figure 15:
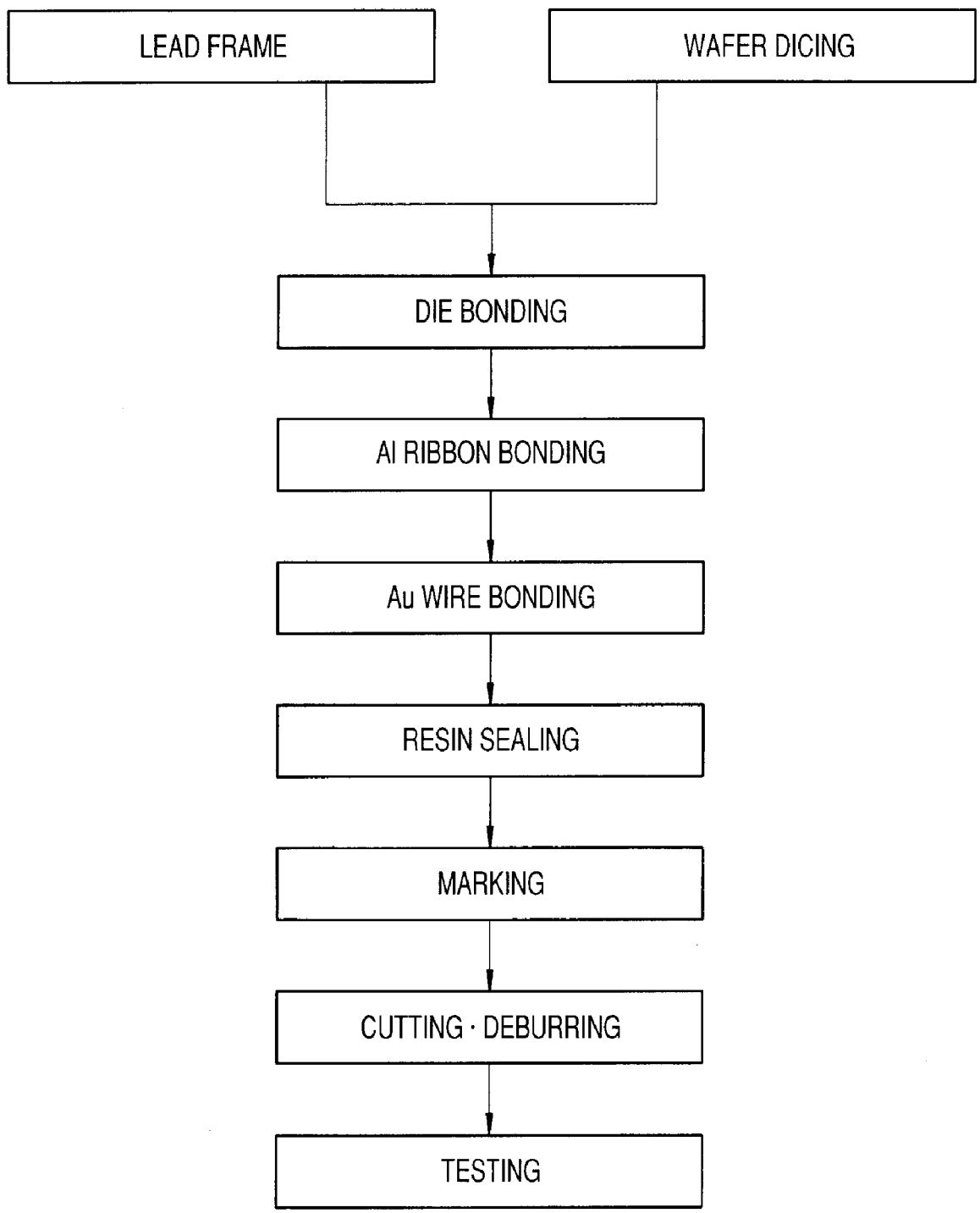
FIG. 15 is an entire flow chart showing a manufacturing process for the semiconductor device according to the first embodiment.

Next, a description will be given below about a method for manufacturing the FLP, including a bonding step of the Al ribbon 8 with use of the wedge tool 10 described above. FIG. 15 is an entire flow chart showing a manufacturing process for the FLP.

Figure 16:
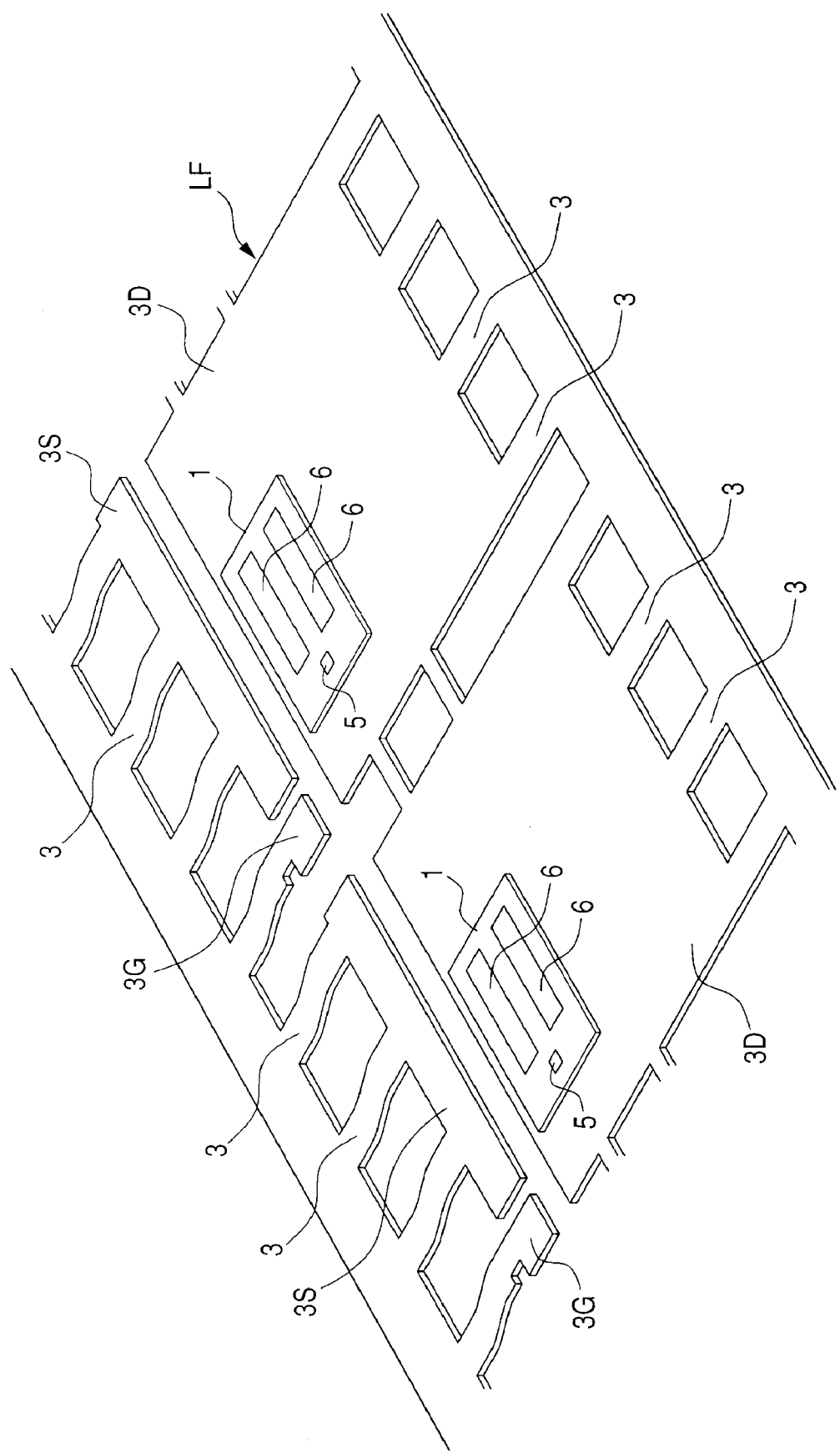
FIG. 16 is a perspective view showing a manufacturing step for the semiconductor device according to the first embodiment.
Figure 17:
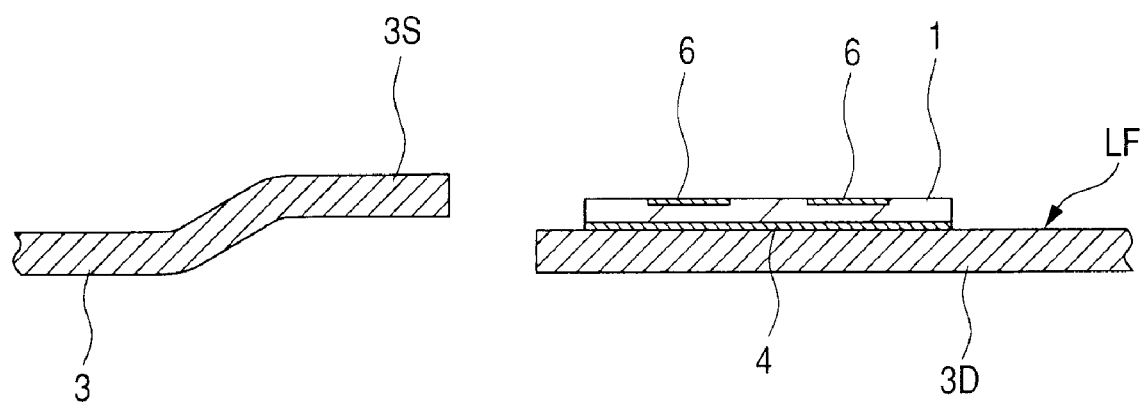
FIG. 17 is a sectional view thereof.

For manufacturing the FLP of this embodiment, first, as shown in FIGS. 16 and 17, a semiconductor chip 1 is mounted onto a die pad portion 3D of a lead frame LF with use of a conductive adhesive 4 such as, for example, Ag paste or solder (Die Bonding).

Figure 18:
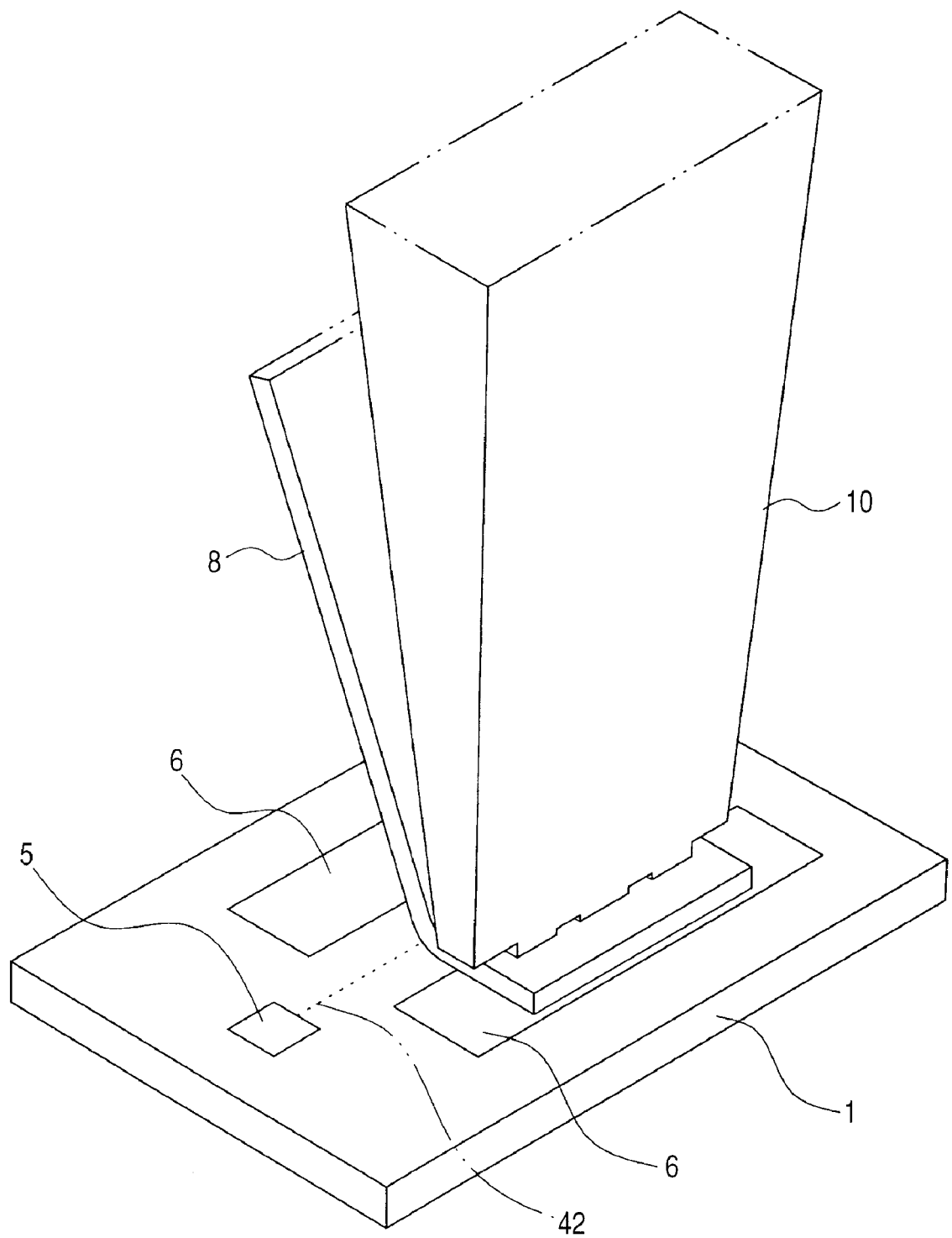
FIG. 18 is a perspective view showing a semiconductor device manufacturing step which follows FIG. 16.
Figure 19:
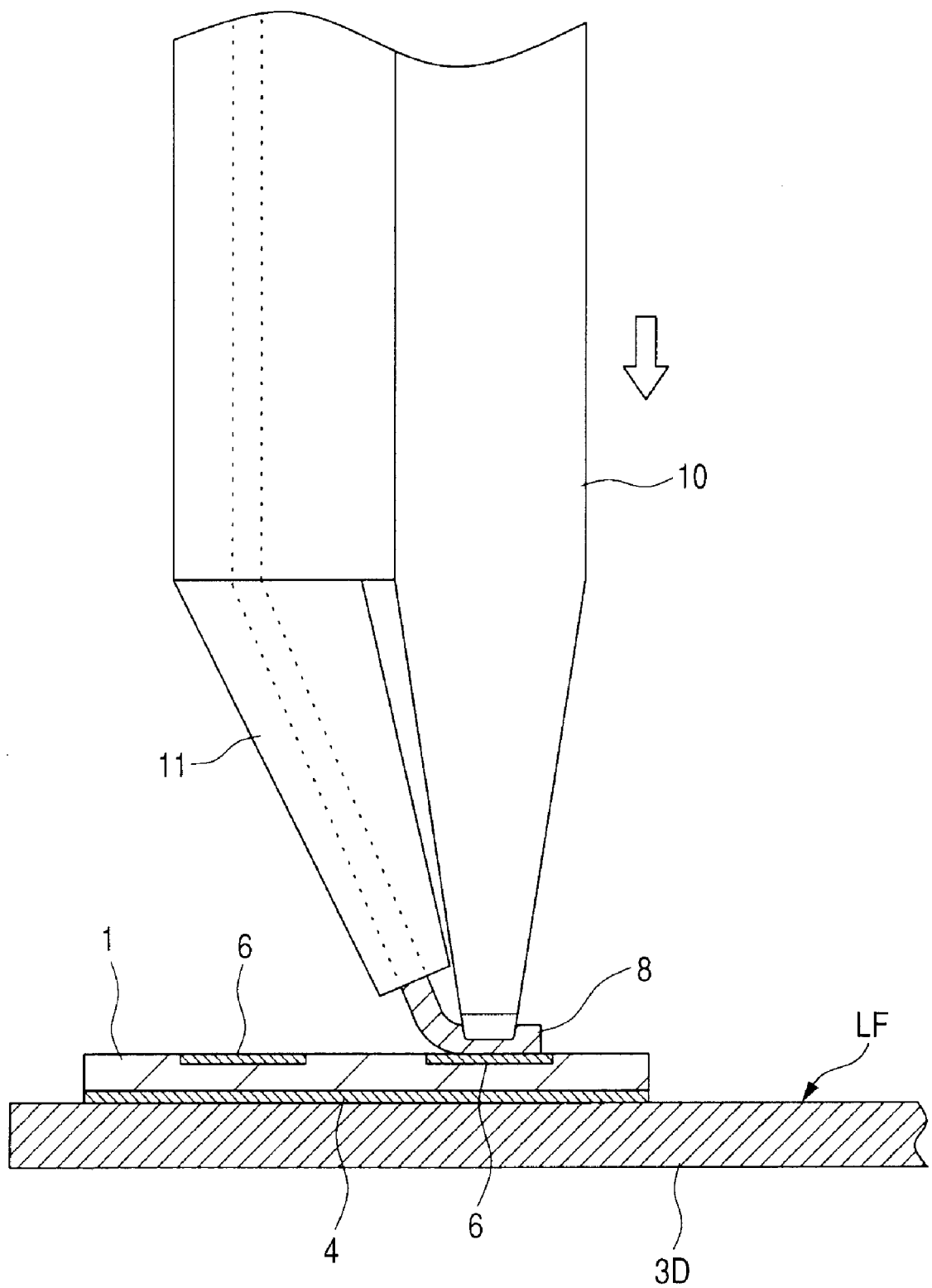
FIG. 19 is a sectional view showing a semiconductor device manufacturing step which follows FIG. 17.

Next, as shown in FIGS. 18 and 19, the front end portion of the Al ribbon delivered from the ribbon guide 11 is positioned on the first source pad 6 of the semiconductor chip 1, then the pressure bonding surface of the wedge tool 10 is brought into pressure contact with the Al ribbon 8 and ultraviolet vibration with energy of several W or so is applied to the ribbon. As a result, the Al ribbon 8 is crushed at its area in contact with the convex portions 10c formed on the pressure bonding surface of the wedge tool 10 and is bonded to the surface of the first source pad 6. As noted above, since recesses 10a are formed in both end portions of the pressure bonding surface of the wedge tool 10, both end portions in the width direction of the Al ribbon 8 bonded to the source pad 6 are not in contact with the pressure bonding surface of the wedge tool 10. Therefore, cracks are not developed in both end portions of the Al ribbon 8 and hence it is possible to prevent cracks from advancing inwards of the Al ribbon 8 and causing breakage of the ribbon.

Figure 20:
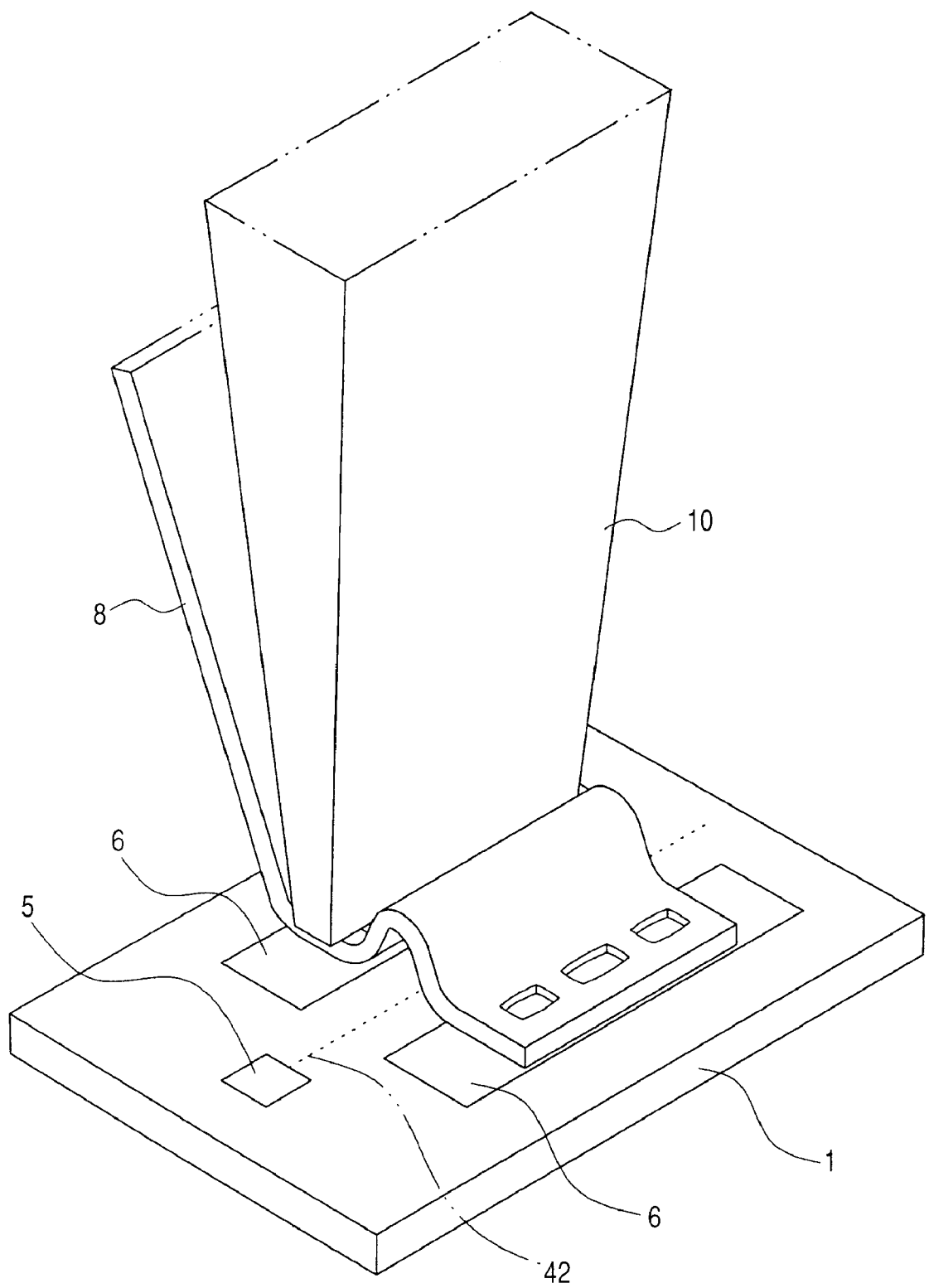
FIG. 20 is a perspective view showing a semiconductor device manufacturing step which follows FIG. 18.
Figure 21:
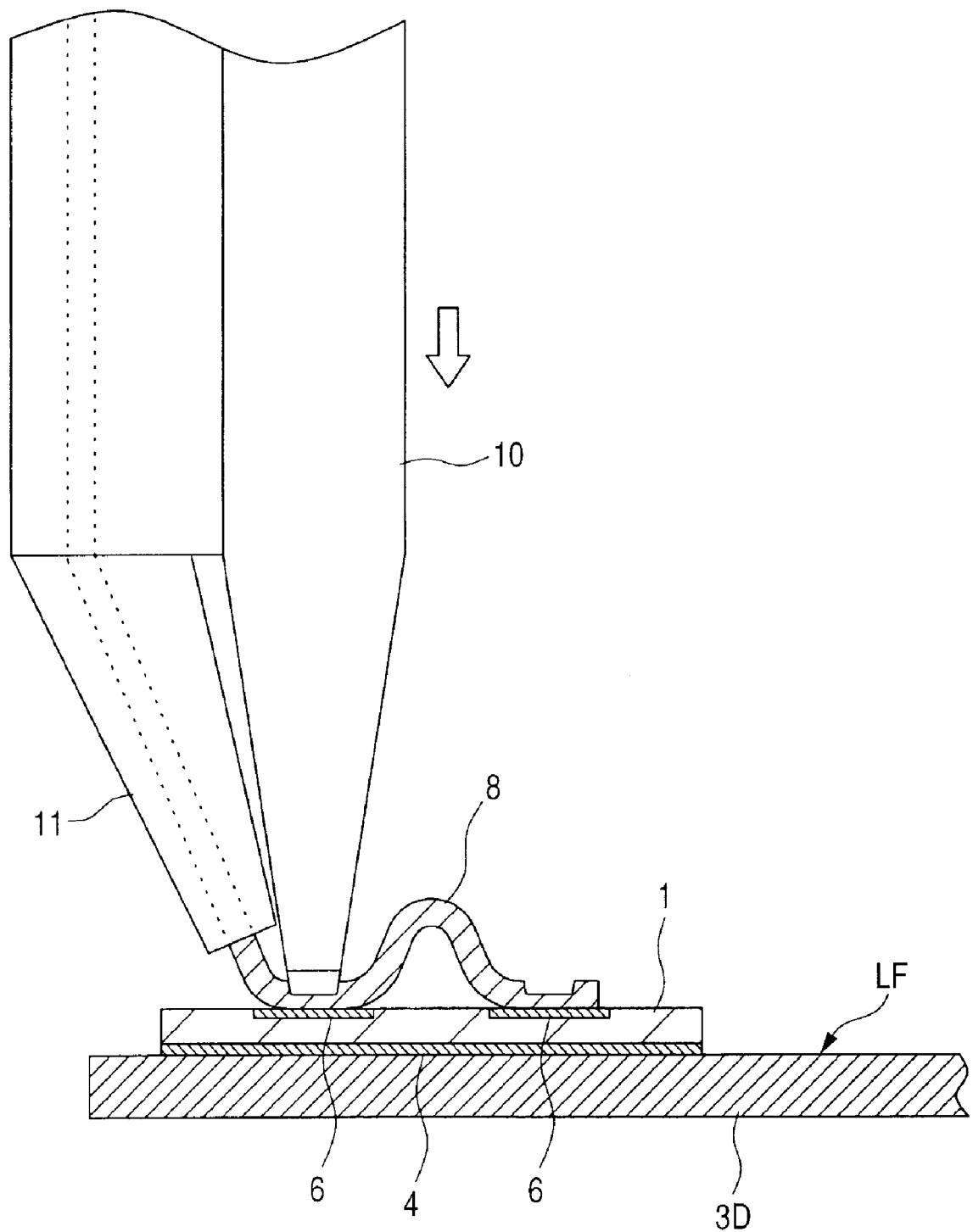
FIG. 21 is a sectional view showing a semiconductor device manufacturing step which follows FIG. 19.

Next, the Al ribbon located between two source pads 6 is looped while moving the wedge tool 10 onto the second source pad 6, then, as shown in FIGS. 20 and 21, the pressure bonding surface of the wedge tool 10 is brought into pressure contact with the Al ribbon 8 and ultraviolet vibration with energy of several W or so is applied to the ribbon. As a result, the Al ribbon 8 is crushed at its area in contact with the convex portions 10c formed on the pressure bonding surface of the wedge tool 10 and is bonded to the surface of the second source pad 6. Also at this time, both end portions in the width direction of the Al ribbon 8 bonded to the second source pad 6 are out of contact with the pressure bonding surface of the wedge tool 10. Thus, also in the bonding of the second source pad 6, cracks are not developed in both end portions of the Al ribbon 8 and hence it is possible to prevent cracks from advancing inwards of the Al ribbon 8 and causing breakage of the ribbon.

As noted earlier, if the Al ribbon 8 is looped at its position between the two source pads 6, the rise of the loop becomes very steep, so that a strong bending stress is imposed on the Al ribbon 8 at the loop rising area. As a result of this strong bending stress imposed on the Al ribbon 8, there may occur breakage of the ribbon. According to an effective measure for relaxing this bending stress, as shown in FIG. 22, with respect to each of the recesses 10b formed in the pressure bonding surface of the wedge tool 10, the radius of curvature (R1) of its corner positioned close to the source post 3S (close to the loop) is made larger than the radius of curvature (R2) of its corner positioned on the front end side of the Al ribbon 8, (R1>R2). By so doing, with respect to each of the thick film portions 8b of the Al ribbon 8, the radius of curvature of its corner positioned close to the source post 3 (close to the loop) becomes larger than the radius of curvature of its corner positioned on the opposite side (the front end side of the Al ribbon 8), so that the bending stress imposed on the Al ribbon 8 is dispersed. On the other hand, by making small the radius of curvature (R2) of the corner positioned on the front end side of the Al ribbon 8, it is possible to ensure a required area of bonding between the Al ribbon 8 and each source pad 6.

Figure 23:
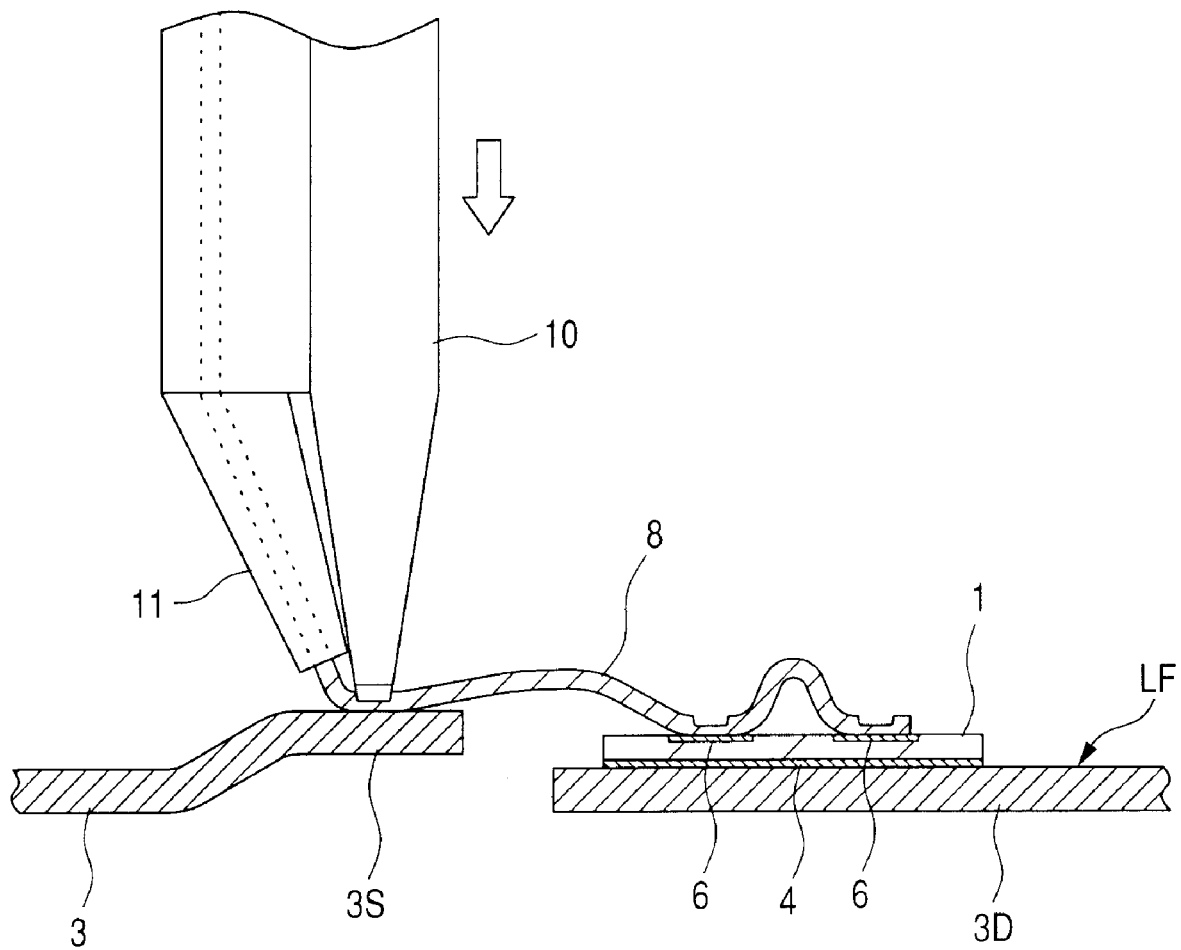
FIG. 23 is a sectional view showing a semiconductor device manufacturing step which follows FIG. 21.
Figure 24:
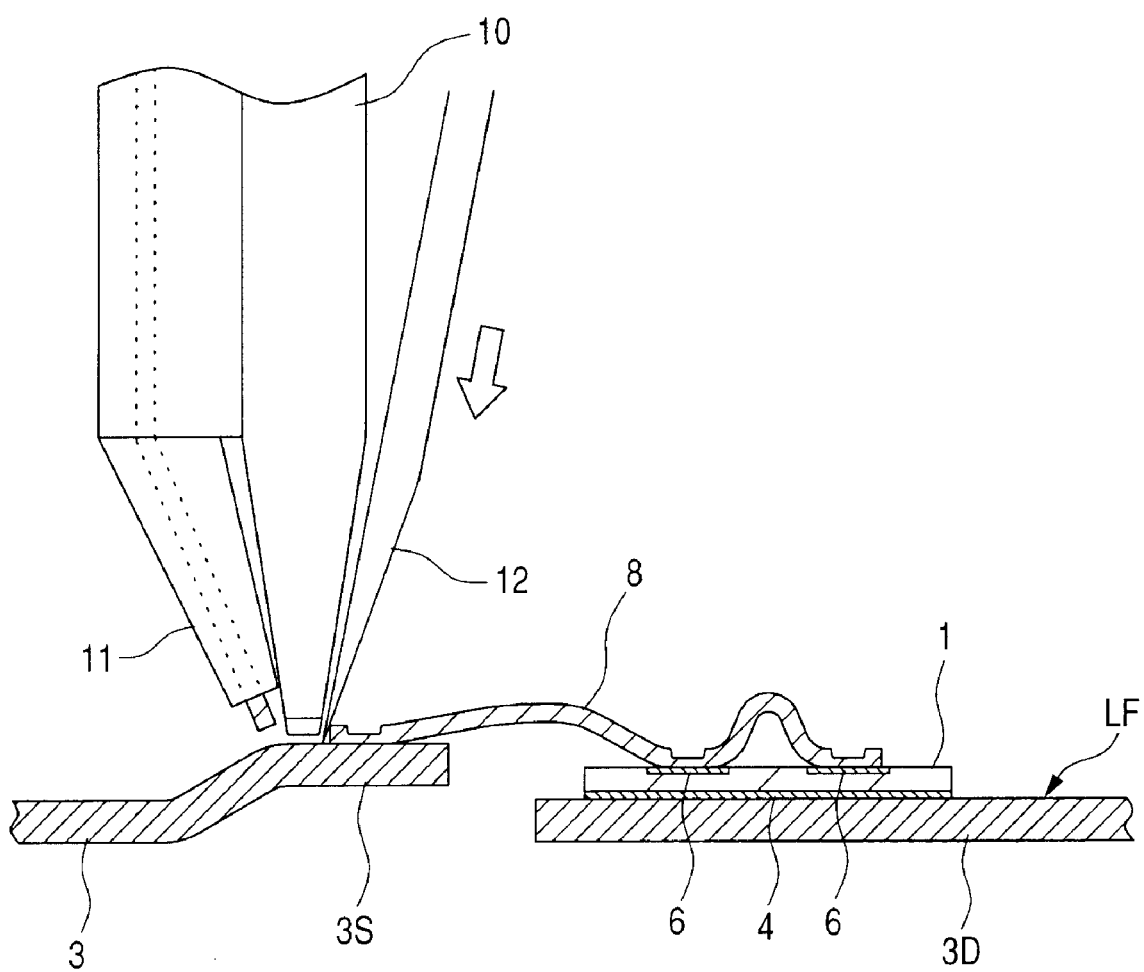
FIG. 24 is a sectional view showing a semiconductor device manufacturing step which follows FIG. 23.

Next, as shown in FIG. 23, the wedge tool 10 is moved onto the source post 3S of the lead frame LF, then its pressure bonding surface is brought into pressure contact with the Al ribbon 8, and the Al ribbon 8 is bonded to the surface of the source post 3S in the same manner as above. Subsequently, as shown in FIG. 24, the Al ribbon 8 is cut with the cutter 12, whereby the ribbon bonding step of coupling the source post 3S with the two source pads 6 electrically by the Al ribbon 8 is completed.

Figure 25:
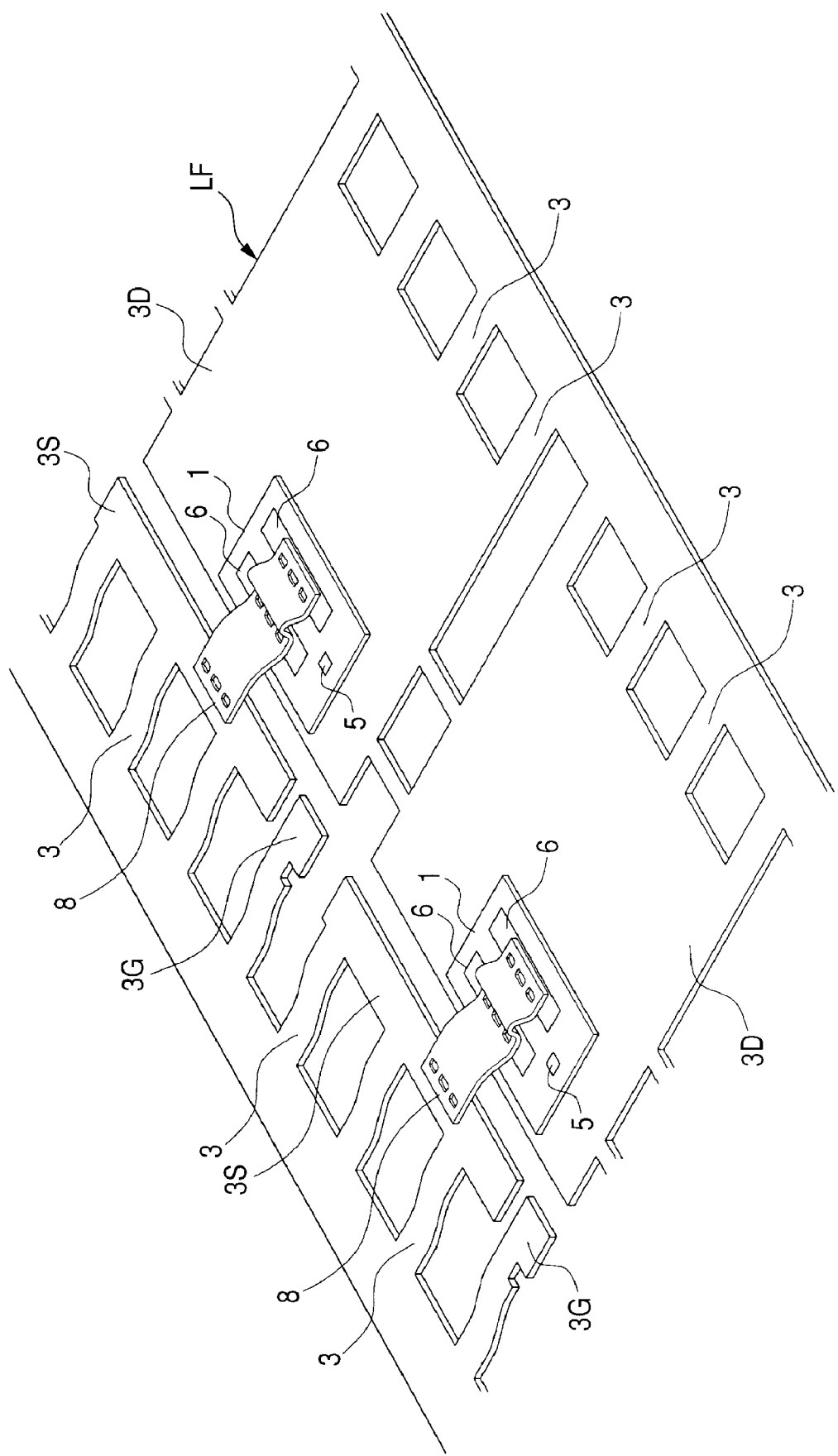
FIG. 25 is a perspective view showing a semiconductor manufacturing step which follows FIG. 24.
Figure 26:
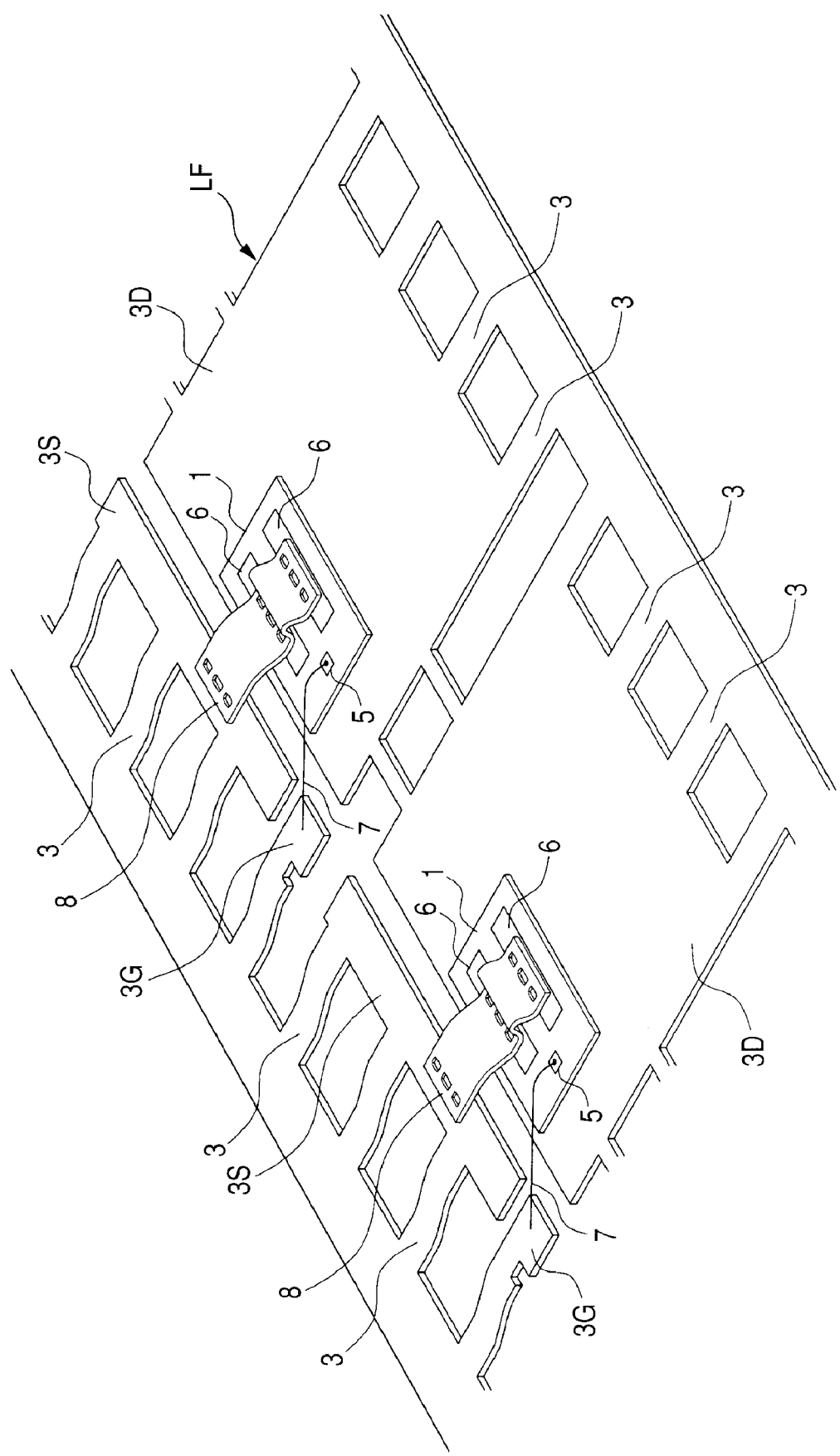
FIG. 26 is a perspective view showing a semiconductor manufacturing step which follows FIG. 25.

In this way the above ribbon bonding step is repeated to couple the source pads 6 and the source post 3S electrically with each other by the Al ribbon 8 with respect to all the semiconductor chips 1 mounted on the ribbon frame LF, as shown in FIG. 25. Thereafter, as shown in FIG. 26, the gate pads 5 and the gate posts 3G of all the semiconductor chips 1 mounted on the lead frame LF are coupled together electrically by means of a known ball bonding device and using Au wires 7.

The bonding step using the Al ribbon 8 and the bonding step using the Au wire 7 may be done in reverse order from the above. That is, bonding of the Al ribbon 8 may be done after bonding of the Au wire 7. However, since the width and thickness of the Al ribbon 8 are each larger than the diameter of the Au wire 7, the vibration energy exerted on the semiconductor chip 1 when bonding the Al ribbon 8 is larger than that exerted on the semiconductor chip 1 when bonding the Au wire 7. Therefore, if bonding of the Al ribbon 8 is performed after bonding of the Au wire 7, the bonding strength between the Au wire and the gate pad 5 decreases due to the vibration energy applied to the chip when bonding the Al ribbon 8. As the case may be, there is a fear of disengagement of the Au wire 7 from the gate pad 5. There also is a fear that the wedge tool 10 used in bonding the Al ribbon 8 may come into contact with the Au wire 7, damaging or cutting the wire. Accordingly, it is preferable that the bonding of Au wire 7 be done after the bonding of Al ribbon 8.

Next, the semiconductor chips 1, Al ribbons 8, Au wires 7, portions of leads 3 and portions of the die pads 3D are sealed with molding resin 2, then product names, etc. are printed on the surface of the molding resin 2 by a laser marking method, thereafter, unnecessary lead frame LF portions exposed to the exterior of the molding resin 2 are cut and resin burrs are removed, and finally a testing step of determining whether the products thus obtained are good or not is carried out. In this way the FLP of this embodiment shown in FIGS. 1 to 4 is completed.

Thus, in this embodiment, the recesses 10a are formed in both end portions of the pressure bonding surface of the wedge tool 10 lest both end portions in the width direction of the Al ribbon 8 should contact the pressure bonding surface of the wedge tool 10. Therefore, even when the extremely thin Al ribbon 8 is bonded to the two source pads 6 disposed close to each other, it is possible to prevent breakage of the Al ribbon 8 while ensuring a required coupling strength between the Al ribbon 8 and the source pads 6.

Moreover, since the radius of curvature (R1) of a corner portion at the pressure bonding surface of the wedge tool 10 is made large, the bending stress imposed on the Al ribbon 8 due to a steep rise of a ribbon loop can be suppressed and hence it is possible to prevent breakage of the Al ribbon 8 in a more positive manner.

Further, since both end portions of the pressure bonding surface of the wedge tool 10 do not come into contact with the Al ribbon 8, even when using the wedge tool 10 repeatedly, deterioration of the pressure bonding surface caused by the deposition of Al powder produced from the Al ribbon 8 is suppressed and hence it is possible to prolong the service life of the wedge tool 10.

Second Embodiment

Figure 27:
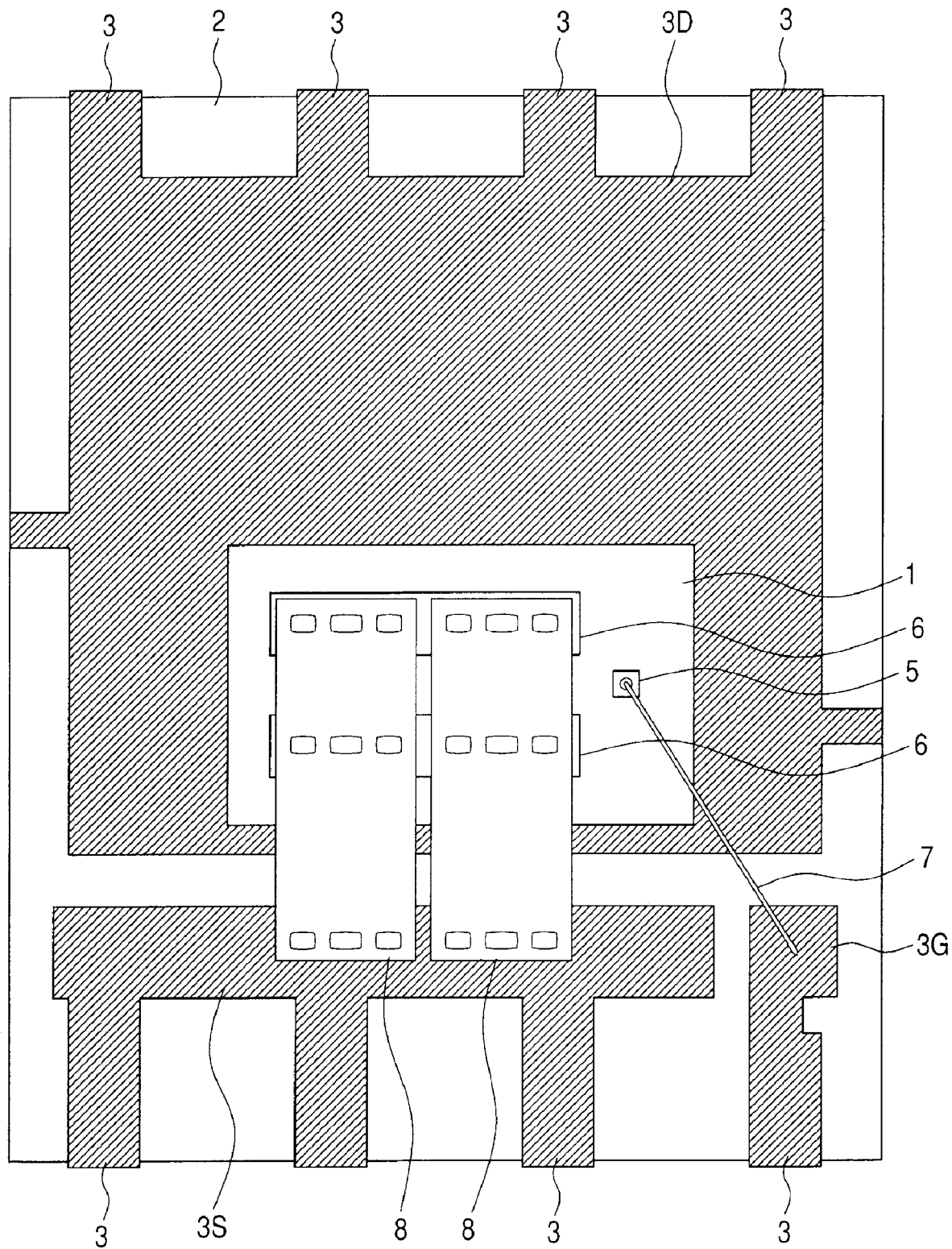
FIG. 27 is a plan view showing an internal structure of a semiconductor device according to a second embodiment of the present invention.

According to an FLP of this second embodiment, as shown in FIG. 27, the source pads 6 of the semiconductor chip 1 and the source post 3S may be coupled together using plural Al ribbons 8. In the illustrated example, the source pads 6 and the source post 3 are coupled together using two Al ribbons 8. The number of Al ribbons 8 for coupling the source pads 6 and the source post 3S may be three or more.

In the FLP, the size of the semiconductor chip 1 differs depending on product type or generation and so does the size of each source pad 6. However, if plural types of Al ribbons 8 different in width are to be provided according to sizes of source pads 6, management of the Al ribbons 8 becomes complicated. On the other hand, as in this embodiment, if one type of Al ribbon 8 of a relatively narrow width is provided and the number of such Al ribbons to be used is changed according to the size of the source pad 6 used, management of the Al ribbon is not complicated.

Also in case of manufacturing the FLP of this embodiment there can be obtained the same effect as in the previous first embodiment by using the above wedge tool 10 in the Al ribbon 8 bonding step.

Third Embodiment

Generally, in the manufacturing process for a resin-sealed type semiconductor device including FLP there is used a lead frame LF having plural die pad portions 3D as in FIG. 16.

Figure 28:
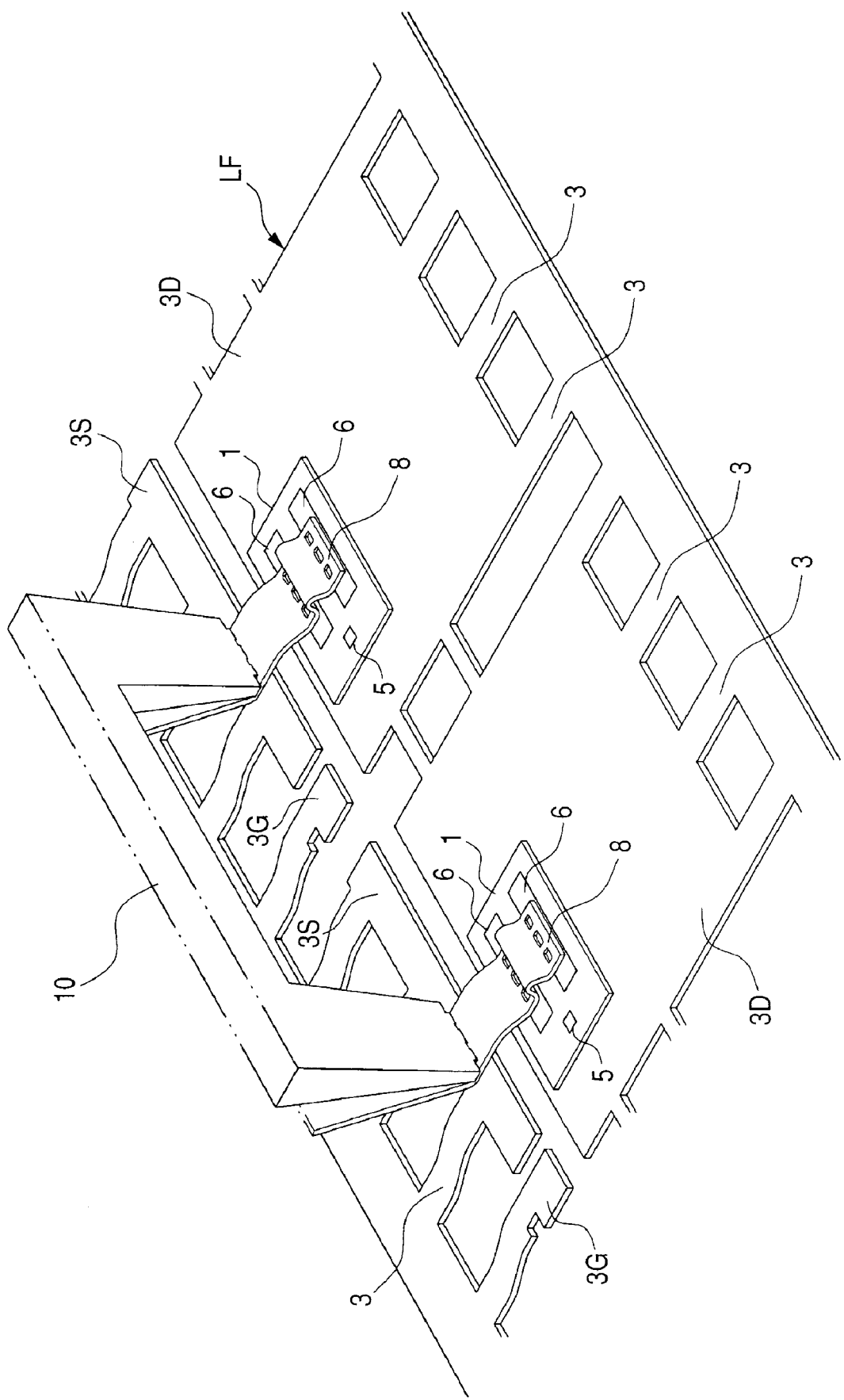
FIG. 28 is a perspective view showing a method for manufacturing a semiconductor device according to a third embodiment of the present invention.

When the source pads 6 of plural semiconductor chips 1 mounted on such a lead frame LF are to be coupled with source posts 3S through Al ribbons 8, the bonding time can be shortened by combining plural wedge tools 10 and coupling Al ribbons 8 simultaneously to the source pads 6 on plural semiconductor chips 1, as shown in FIG. 28.

Also in this case, the same effect as in the first embodiment can be obtained by using the combined wedge tool 10.

Although the present invention has been described above by way of embodiments, it goes without saying that the present invention is not limited to the above embodiments and that various changes may be made within the scope not departing from the gist of the invention.

Although in the above embodiments there was used Al ribbon as a conductive material for coupling between the source pads and the source post, there also may be used ribbons made of other materials small in electric resistance such as, for example, Au or Cu alloy. Moreover, as the gate post—gate pad coupling conductive material there also may be used a wire made of any other material than Au, e.g., Al wire or Cu wire.

Although in the above embodiments a semiconductor chip is mounted on the die pad portion with use of Ag paste, there also may be used any other material for mounting as pellet than Ag paste, e.g., solder paste or solder ribbon. Further, the chip mounting portion of the die pad portion 3D may be plated with solder. In case of performing soldering by solder ribbon or solder plating, it is possible to ensure required solder wettability by also using an activating agent such as flux for example. In case of coupling a semiconductor chip with solder, both wettability of solder and couplability with solder can be ensured by metalizing a soldering surface (back surface of the chip) with Ni/Au for example.

Although in the above embodiments FLP was shown as an example of a resin package for sealing the semiconductor chip formed with power MOSFETs, the present invention is applicable also to a SOP-8 for example.

Figure 29:
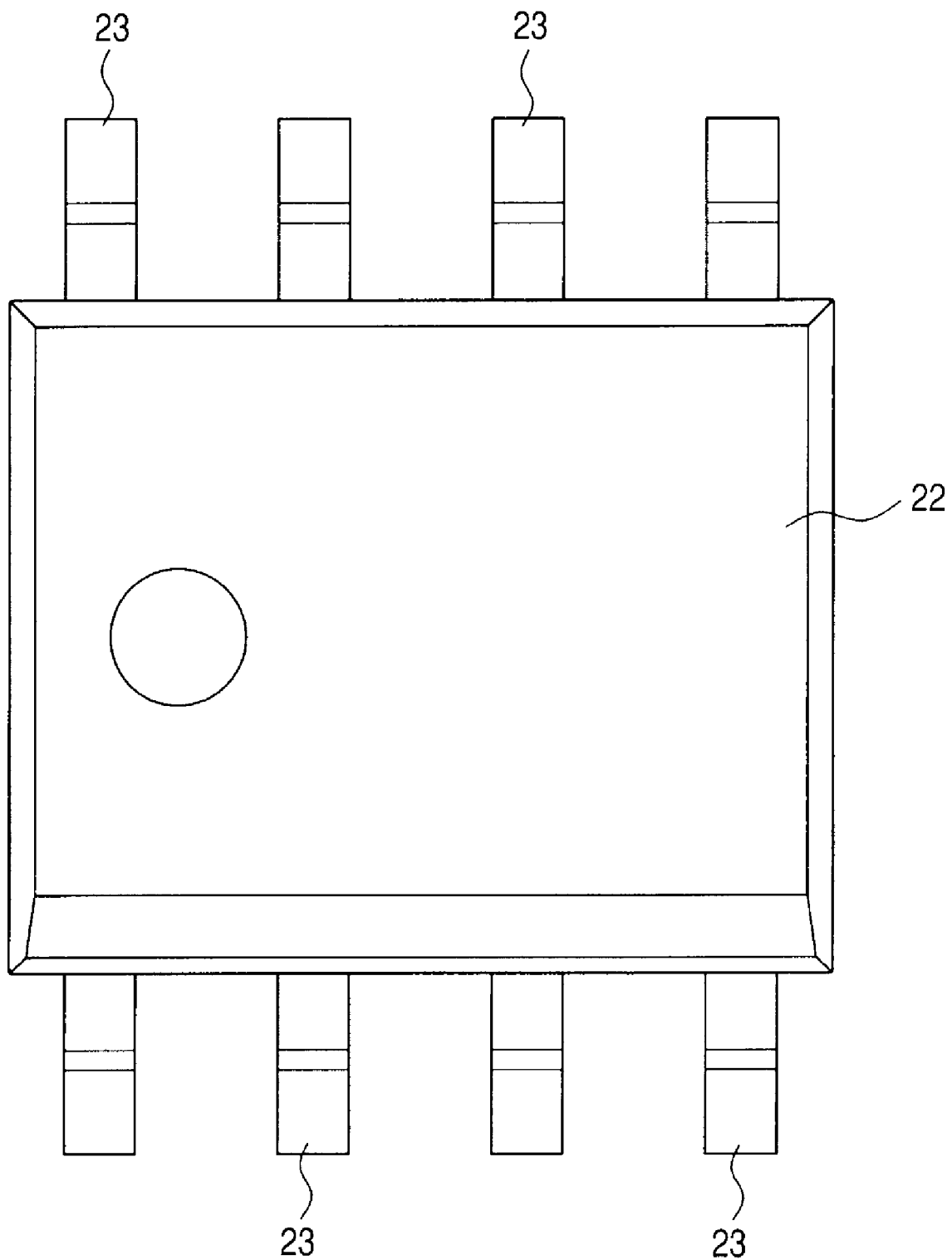
FIG. 29 is a plan view showing an upper surface of a semiconductor device according to a further embodiment of the present invention.
Figure 30:
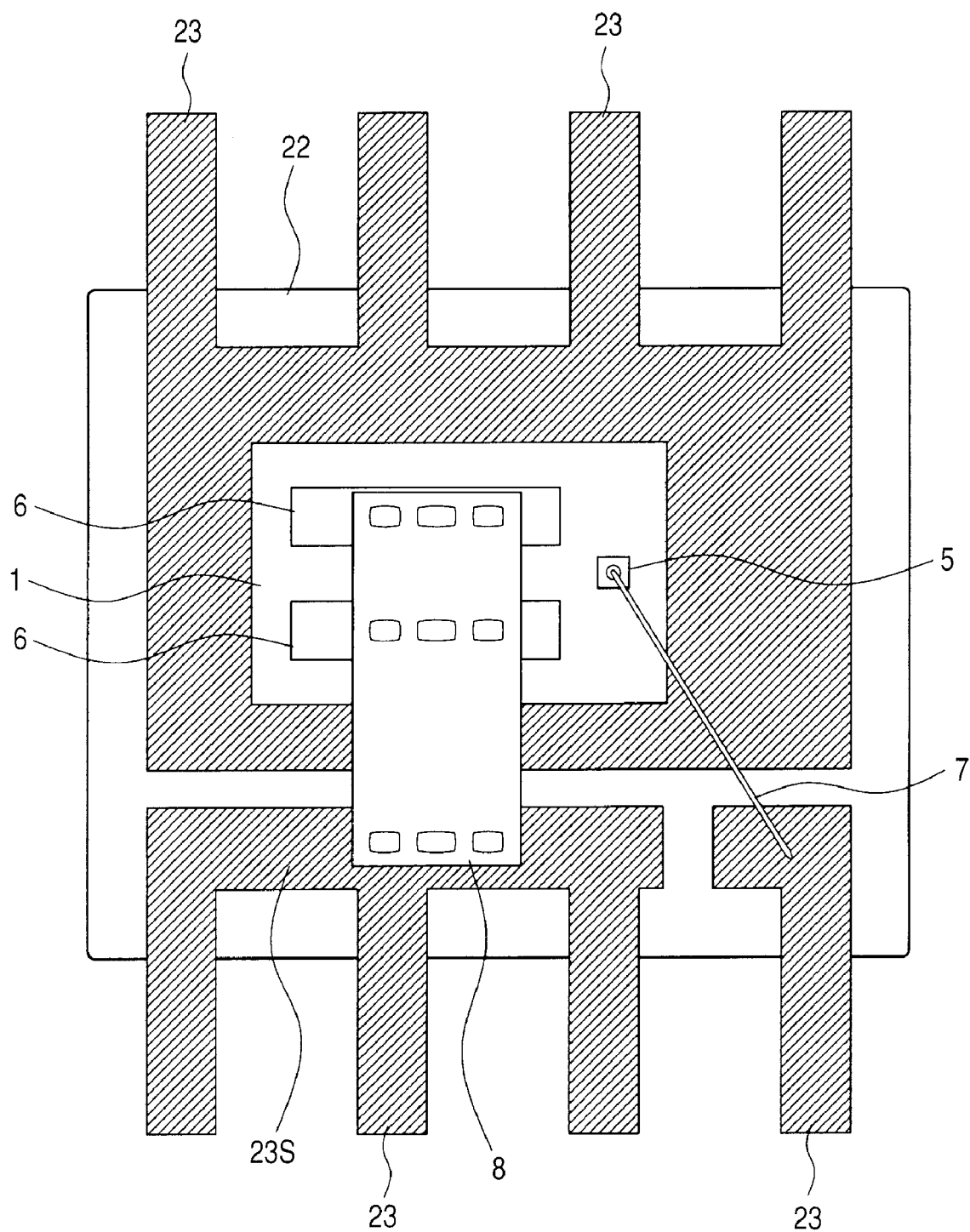
FIG. 30 is a plan view showing an internal structure of the semiconductor device shown in FIG. 29.

FIG. 29 is a plan view showing an upper surface of a SOP-8. The SOP-8, like FLP, is also a kind of a small-sized surface mount package and the pin layout of eight leads 23 exposed to the exterior of the molding resin 22 is also the same as in FLP, but each of the leads 23 is formed in a gull wing shape. FIG. 30 is a plan view showing an internal structure of a SOP-8 wherein the semiconductor chip 1 used in the first embodiment is sealed with molding resin 22. Also in this case, by using the wedge tool described in the previous embodiments at the time of coupling the source pads 6 and a source post 23S with use of the Al ribbon 8, it is possible to prevent breakage of the Al ribbon 8 while ensuring the bonding strength of the ribbon.

Figure 31:
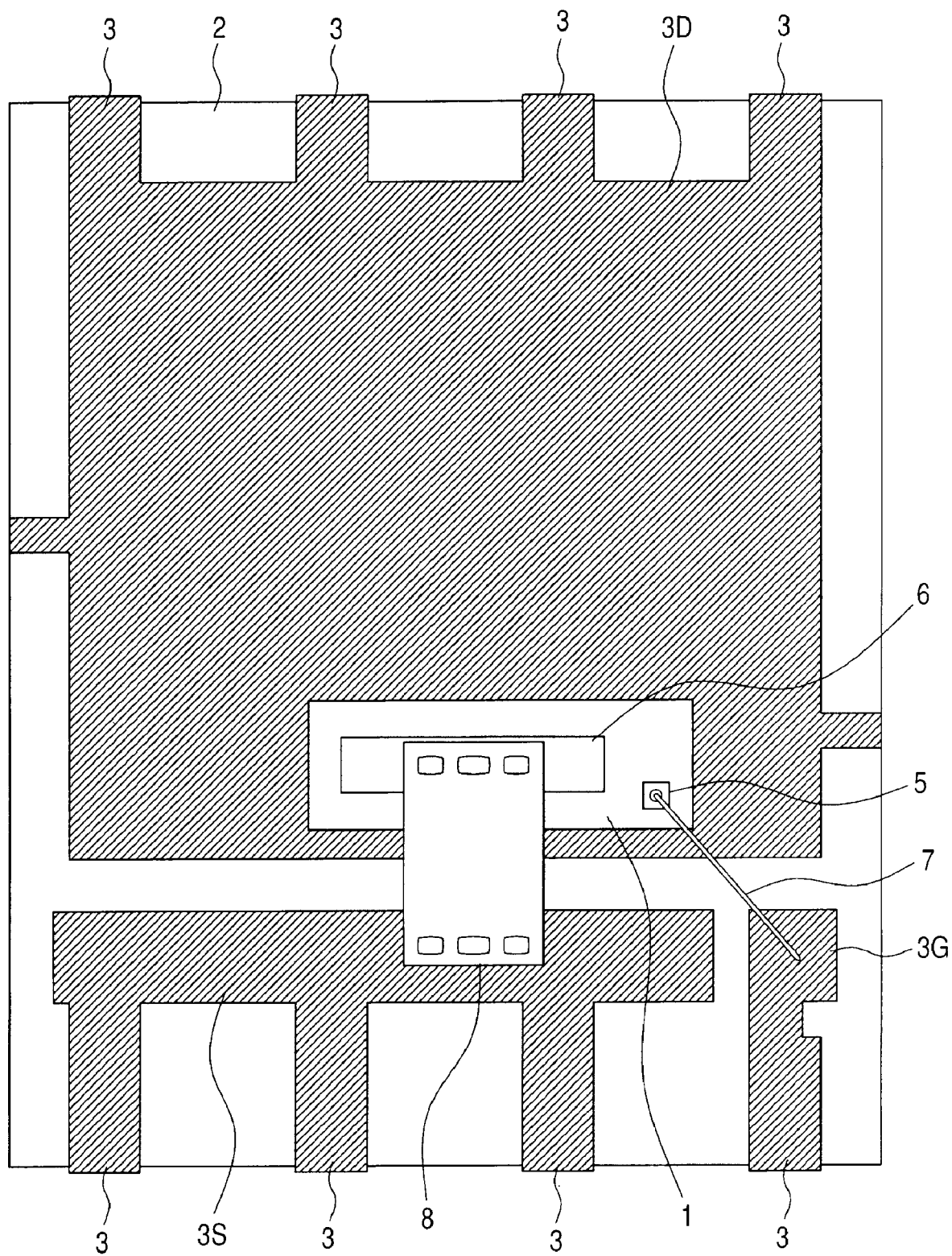
FIG. 31 is a plan view showing an internal structure of a semiconductor device according to a still further embodiment of the present invention.

Although in the above embodiments a description has been given about the case where the Al ribbon is bonded to the semiconductor chip having two (plural) source pads, the present application is applicable also to the case where the Al ribbon 8 is bonded to a semiconductor chip 1 having one source pad 6, as shown in FIG. 31. That is, as the semiconductor chip size becomes extremely small, the source pad—source post spacing also becomes narrow and a loop of the Al ribbon formed between the source pad and the source post becomes steep. Therefore, for preventing breakage of the Al ribbon while ensuring the bonding strength of the ribbon, the use of the wedge tool described in the above embodiments is effective.

Further, although in the above embodiments the Al ribbon is bonded to the source pads of the semiconductor chip formed with power MOSFETs, semiconductor chips formed with other elements than power MOSFETS are also employable if only they have a pad capable of being bonded with the Al ribbon. For example, in the case of a semiconductor chip formed with insulated gate bipolar transistors (IGBTs), the present invention can be applied thereto also in case of bonding the Al ribbon to an emitter pad because the emitter pad is formed at a wider area than a gate pad in order to decrease ON resistance of the IGBTs.

The present invention is applicable to a semiconductor device wherein a bonding pad of a semiconductor chip and a lead frame are coupled together using a metallic ribbon.

What is claimed is:

1. A semiconductor device comprising:
a semiconductor chip having a main surface and a back surface on the side opposite to the main surface;
a pad formed over the main surface of the semiconductor chip;
a first conductor disposed near the semiconductor chip; and
a metallic ribbon for coupling the pad and the first conductor electrically with each other,
wherein the metallic ribbon coupled to the pad of the semiconductor chip is thicker at both end portions in a width direction thereof than a portion located between the both end portions.

2. A semiconductor device according to claim 1, wherein a thin film portion thinner than the both end portions of the metallic ribbon is formed between the both end portions.

3. A semiconductor device according to claim 2, wherein a plurality of the thin film portions are formed.

4. A semiconductor device according to claim 3, wherein the radius of curvature of a first corner of a thick film portion sandwiched between adjacent ones of the thin film portions is larger than the radius of curvature of a second corner opposed to the corner of the thick film portion, said first corner being closer than the second corner to the first conductor.

5. A semiconductor device according to claim 4,
wherein a plurality of the pads are formed over the main surface of the semiconductor chip, and
wherein the metallic ribbon is coupled electrically to each of the plurality of the pads.

6. A semiconductor device according to claim 5, wherein power elements are formed over the main surface of the semiconductor chip.

7. A semiconductor device according to claim 6, wherein the power elements are power MOSFETs, and the plurality of the pads are source pads of the power MOSFETs.

8. A semiconductor device according to claim 7,
wherein a gate pad smaller in pad area than each of the source pads is formed over the main surface of the semiconductor chip, and
wherein a second conductor is disposed near the semiconductor chip, the gate pad and the second conductor being coupled together electrically through a metallic wire.

9. A semiconductor device according to claim 8, wherein the gate pad is coupled electrically to gate electrodes of the power MOSFETs through a gate lead electrode formed between the source pads.

10. A semiconductor device according to claim 9, wherein a loop is formed in the metallic ribbon coupled to each of the source pads.

11. A semiconductor device according to claim 10, further comprising a die pad portion with the semiconductor chip mounted thereover,
wherein the first and second conductors are leads, and
wherein the semiconductor chip, the metallic ribbon, the metallic wire, part of the leads, and part of the die pad portion, are sealed with resin.

12. A semiconductor device according to claim 11, wherein the metallic ribbon is formed of aluminum.

13. A method for manufacturing a semiconductor device, comprising:
bonding a metallic ribbon to a pad formed over a main surface of a semiconductor chip,
wherein a wedge tool is used in the bonding step,
the wedge tool has respective first recesses at opposite end portions of a pressure bonding surface thereof,
the metallic ribbon has end portions in a width direction thereof, the first recesses of the wedge tool being opposed to respective end portions of the metallic ribbon in the bonding step,
the wedge tool has a second recess between said end portions of the pressure bonding surface, and
a depth of each of the first recesses is larger than a depth of the second recess.

14. A method according to claim 13,
wherein, in the bonding step, the second recess is positioned with two sides thereof extending in the width direction of the metallic ribbon, and
wherein end portions of the pressure bonding surface extending along the two sides are different in the radius of curvature from each other.

15. A method according to claim 14, wherein a plurality of the second recesses are formed between the both end portions of the pressure bonding surface.

16. A method according to claim 15,
wherein a plurality of the pads are formed over the main surface of the semiconductor chip, and
wherein the metallic ribbon is coupled electrically to each of the plurality of the pads.

17. A method according to claim 16, wherein a loop is formed in the metallic ribbon over each of the plurality of the pads.

18. A method according to claim 17, further comprising the step of bonding a metallic wire after the metallic ribbon bonding step.

* * * * *